United States Patent [19]
Yetter

[11] Patent Number: 5,389,835
[45] Date of Patent: * Feb. 14, 1995

[54] VECTOR LOGIC METHOD AND DYNAMIC MOUSETRAP LOGIC GATE FOR A SELF-TIMED MONOTONIC LOGIC PROGRESSION

[75] Inventor: Jeffry D. Yetter, Ft. Collins, Colo.

[73] Assignee: Hewlett-Packard Company, Palo Alto, Calif.

[ * ] Notice: The portion of the term of this patent subsequent to May 4, 2010 has been disclaimed.

[21] Appl. No.: 14,881

[22] Filed: Feb. 3, 1993

Related U.S. Application Data

[63] Continuation-in-part of Ser. No. 684,720, Apr. 12, 1991, Pat. No. 5,208,490.

[51] Int. Cl.$^6$ .......................................... H03K 19/094
[52] U.S. Cl. ....................................... 326/98; 326/119; 326/21
[58] Field of Search .......................... 307/443, 451–453

[56] References Cited

U.S. PATENT DOCUMENTS

| | | | |
|---|---|---|---|
| 4,352,031 | 9/1982 | Holbrook et al. | 307/444 |
| 4,468,575 | 8/1984 | Mathes | 307/481 |
| 4,560,032 | 2/1986 | Lee | 364/787 |
| 4,570,084 | 2/1986 | Griffin et al. | 307/452 |
| 4,682,055 | 7/1987 | Upadhyayula | 307/451 |
| 4,692,637 | 9/1987 | Shoji | 307/443 |
| 4,700,086 | 10/1987 | Ling et al. | 307/443 |
| 4,730,266 | 3/1988 | van Meerbergen et al. | 364/787 |
| 4,792,893 | 12/1988 | Nakagawa et al. | 364/200 |
| 4,827,160 | 5/1989 | Okano | 307/443 |
| 4,841,174 | 6/1989 | Chung | 307/469 |
| 4,899,066 | 2/1990 | Awikawa et al. | 307/45.2 |
| 4,983,860 | 1/1991 | Yim et al. | 307/443 |
| 5,015,822 | 5/1991 | Houston et al. | 307/452 |
| 5,208,490 | 5/1993 | Yetter | 307/452 |

FOREIGN PATENT DOCUMENTS

| | | | |
|---|---|---|---|
| 0137933 | 4/1985 | European Pat. Off. | ... H03K 19/094 |
| 3248215C2 | 8/1973 | Germany | G03F 15/347 |
| 3401995C2 | 9/1984 | Germany | G03F 15/347 |
| 3446957C2 | 7/1985 | Germany | G03F 9/38 |
| 3506749C2 | 9/1985 | Germany | G03F 15/347 |
| 3827500A1 | 2/1989 | Germany | G03F 9/33 |
| 1561197 | 2/1980 | United Kingdom | H03K 17/00 |

OTHER PUBLICATIONS

"Principles of CMOS VLSI Design a Systems Perspective," Weste et al. Jun. 1988, pp.168–171.
Introduction of VLSI Systems, Mead et al. Addison Wesley 1980, pp. 242–261.

*Primary Examiner*—David R. Hudspeth

[57] ABSTRACT

A dynamic mousetrap logic gate implements a self-timed monotonic logic progression via a novel vector logic method. In the vector logic method, a vector logic variable is defined by a plurality of vector components situated on respective logic paths. Boolean as well as non-Boolean variables can be represented. Further, timing information is encoded in the vector logic variable itself by defining the vector logic variable as invalid when all the vector components currently exhibit a logic low and by defining the vector logic variable as valid when a subset of the vector components exhibits a logic high. With a plurality of valid vector logic states, subsets defining valid vector logic states are nonoverlapping. The mousetrap logic gate comprises a plurality of gate components in parallel, corresponding with each output vector component. Each gate component has an arming mechanism, a ladder logic, and an inverting buffer mechanism. The ladder logic performs logic functions on one or more input vectors and provides the result to the inverting buffer mechanism. The arming mechanism periodically precharges the inverting buffer input to drive the gate component output to a logic low until the inverting buffer mechanism is triggered by the ladder logic.

68 Claims, 14 Drawing Sheets

VECTOR LOGIC METHOD AND DYNAMIC MOUSETRAP LOGIC GATE FOR A SELF-TIMED MONOTONIC LOGIC PROGRESSION

The present invention is a continuation-in-part of "A FUNCTIONALLY COMPLETE FAMILY OF SELF-TIMED DYNAMIC LOGIC CIRCUITS" by Jeffry Yetter, filed Apr. 12, 1991, having Ser. No. 07/684,720, now U.S. Pat. No. 5,208,490.

BACKGROUND OF THE INVENTION

1. Field of the Invention

The present invention relates generally to logic circuits and, more particularly, to a vector logic method and a dynamic mousetrap logic gate for implementing a self-timed monotonic logic progression with concise hardware requirements.

2. Related Art

Dynamic logic gates are used in the conventional design of logic circuits which require high performance and modest size. Dynamic logic gates require a periodic precharge to maintain and properly perform their intended logic function. In general, the precharge charges parasitic capacitances at a gate output node in order to sustain a logic state. However, once the precharge in the dynamic logic gate has been discharged, the gate can no longer perform another logic function until again precharged.

Examples of dynamic logic circuits are described in U.S. Pat. No. 5,015,882 to Houston et al. (domino logic), U.S. Pat. No. 4,899,066 to Aikawa et al., U.S. Pat. No. 4,841,174 to Chung et al., U.S. Pat. No. 4,827,160 to Okano, U.S. Pat. No. 4,730,266 to van Meerbergen et al., U.S. Pat. No. 4,700,086 to Ling et al., U.S. Pat. No. 4,692,637 to Shoji, U.S. Pat. No. 4,570,084 to Griffin et al., U.S. Pat. No. 4,569,032 to Lee, U.S. Pat. No. 4,468,575 to Mathes, and U.S. Pat. No. 4,352,031 to Holbrook et al.

Although meritorious to an extent, the use of conventional dynamic logic gates in logic networks has been limited historically because of associated design problems. Most dynamic logic gates suffer from functional incompleteness in that only non-inverting logic functions can be performed. An example of a dynamic logic family suffering from functional incompleteness is the well known domino logic. In this regard, see Weste, N. E., *Principles Of CMOS VLSI Design*, "CMOS Domino Logic," Section 5.525, p. 168, June 1988 and U.S. Pat. No. 5,015,882 to Houston et al. High performance adder logic circuits and multiplier logic circuits invariably require logic inversions in the critical logic path, as is well known in the art. Consequently, adder logic circuits and multiplier logic circuits are generally not built with conventional dynamic logic gates.

Furthermore, in many instances, conventional dynamic logic gates cannot be cascaded to perform combinational logic functions and still maintain their proper dynamic nature. Specifically, "static hazards," or "output skew," can arise. A static hazard is an inherent condition which occurs in combinational logic configurations as a result of propagation time delays. For example, consider a two-input exclusive-OR gate in a conventional binary logic system when both inputs are high and then both concurrently turn low. From a Boolean logic perspective, the output of the exclusive-OR gate should remain low before, during, and after the transition. However, in reality, one of the inputs will change just before the other. Consequently, the output of the exclusive-OR gate will undesirably and suddenly bounce high then low during the transition time. In a series of dynamic logic gates having an odd number of inversions in a logic path, static hazards will result in logic errors because the dynamic logic gates, once triggered, cannot further respond until again precharged.

U.S. Pat. No. 4,570,084 to Griffin et al. teaches a differential dynamic logic gate which is functionally complete and which does not exhibit static hazard problems. The Griffin gate practices well known binary decomposition in that it provides a pair of complementary outputs in response to complementary inputs. The Griffin gate has dual logic networks for receiving respectively an input and its complement. The dual logic networks are connected to respective dual inverters. Further, dual precharging mechanisms are disposed for precharging each input of the dual inverters.

The Griffin gate solves the static hazard problem by providing for a monotonic logic progression using binary decomposition with differential dynamic logic gates. A monotonic logic progression is the progression of logic evaluations on a logic path through a logic network wherein only the state transition from either low to high or high to low is considered on each logic path. In the Griffin gate, to implement a monotonic logic progression by considering only state transitions from low to high, complementary binary logic states are clocked from gate to gate. For every Q logic path, there is a complementary −Q logic path. Essentially, each logic path has been expanded into a two-rail path, one rail dedicated to propagating a logic low and one rail dedicated to propagating a logic high. Worth noting is that binary decomposition, and particularly, the dual-rail logic system, has been well known since the beginning of the computer era.

Another technique for achieving high performance in logic networks is to employ "self-timed" logic elements. Self-timed logic networks are considered very sophisticated in the art and are not completely understood by many designers. Thus, they have been implemented only to a very limited extent in logic networks. In a self-timed logic network, control of logic evaluations through the logic elements is delegated to the logic elements themselves, as opposed to a clock. Self-timed behavior is analogous to the scenario where an airplane does not depart until after all passengers scheduled for the flight have boarded the airplane. In self-timed systems, designers try to ensure that all system events occur in proper sequence, but nothing ever needs to occur at a particular time. For a further discussion of the concept of self-timing as well as the related valid and invalid states, refer to Weste and Eshraghian, *Principles of CMOS VLSI Design*, §§ 5.2.5–5.2.7, pp. 168–171, June 1988.

To date, no dynamic logic design has been developed which exhibits functional completeness, does not suffer from static hazards, and can employ self-timed elements in order to maximize performance.

SUMMARY OF THE INVENTION

The present invention is vector logic method and a dynamic mousetrap logic gate for implementing a self-timed monotonic logic progression in a logic network. Generally, the vector logic method and the mousetrap logic gate offer a new, high performance, design option for logic engineers and designers.

In the vector logic method, a "vector logic variable," or "vector," is defined by a plurality of vector components situated on a plurality of logic paths of the logic network. Vector logic variables can encode Boolean as well as non-Boolean logic variables. Further, timing information is provided, or encoded, in the vector logic variable itself by (1) defining the vector logic state as "invalid" when all the logic states concurrently exhibit a logic low and by (2) defining the vector logic state as "valid" when a predetermined subset of the logic states exhibits a logic high. Moreover, each subset corresponding with a particular vector logic state is nonoverlapping with other subsets. In other words, validity is determined by the vector logic state at an instant in time, not by a clock as in a traditional clocked system.

The vector logic method has many desirable advantages. Because a plurality of valid vector logic states are possible, unlike conventional binary logic systems having only two valid logic states, logic evaluations can be performed in a logic network in a monotonic progression without static hazards. Moreover, because timing information can be encoded in the vector logic state itself, logic gates can be designed to operate as independent self-timed elements, thereby optimizing speed and performance. Finally, implementation of the vector logic method requires much less hardware than implementation of binary decomposition, and specifically, a dual-rail system.

A mousetrap logic gate in accordance with the present invention implements the novel vector logic method and the self-timed monotonic progression. The mousetrap logic gate comprises a plurality of gate components in parallel. The gate components are concise circuit elements which perform logic evaluations on a set of input vectors and provide an output vector.

Each gate component has a ladder logic connected to a plurality of gate inputs and to an inverting buffer. The ladder logic of each gate component performs logic functions on one or more of the input vectors. The inverting buffer provides a gate component output after receipt of a ladder logic output. An arming mechanism periodically precharges, or energizes, the inverting buffer to drive the gate component output to a logic low until the inverting buffer is triggered by the ladder logic output. As an analogy, the arming mechanism sets a kind of "mousetrap." When all gate components maintain their respective outputs at a logic low, then an invalid output vector is present.

Mousetrap logic gates are very fast and are functionally complete in that they can directly perform inverting and noninverting functions, unlike most conventional dynamic logic gates. As a result, high performance adder logic circuits and multiplier logic circuits which require many logic inversions can be easily designed and implemented.

Furthermore, mousetrap logic gates are a concise logic circuit, requiring minimal hardware for implementation. The foregoing factor is extremely important in the design of sophisticated logic networks requiring a multitude of logic manipulations.

Other features and advantages of the present invention will become apparent to one skilled in the art upon examination of the following drawings and the detailed description. It is intended that any additional features and advantages be incorporated herein.

BRIEF DESCRIPTION OF THE DRAWINGS

The present invention, as defined in the claims, can be better understood with reference to the following drawings.

DETAILED DESCRIPTION OF THE PREFERRED EMBODIMENTS

1. Vector Logic Method

Figure 1:
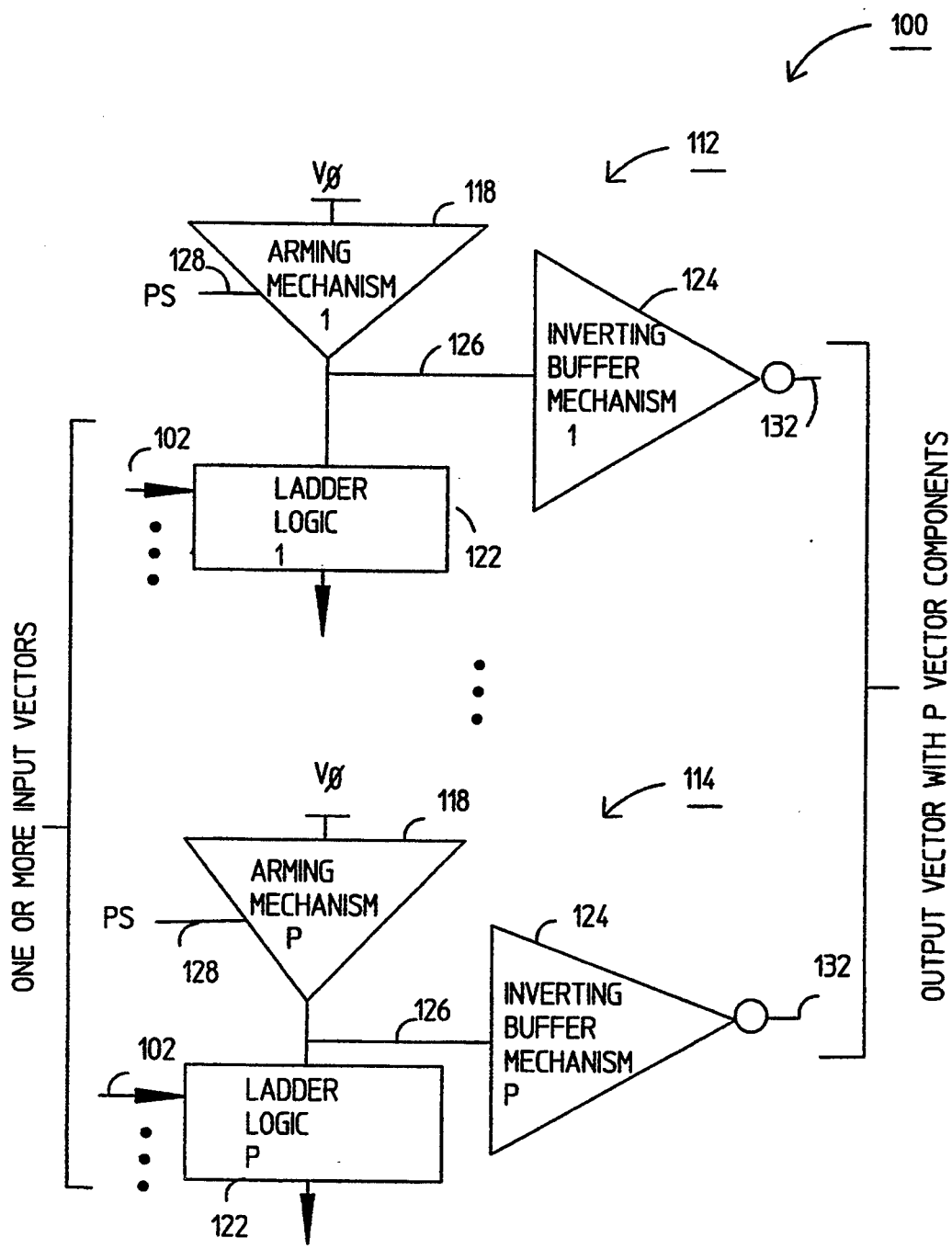
FIG. 1 is a block diagram of a family of mousetrap logic gates of the present invention.

Typically, logic is encoded in a binary manner on a single logic path, which is oftentimes merely an electrical wire or semiconductor throughway. By definition, a high signal level, usually a voltage or current, indicates a logic high (in Boolean logic, a "1"). Moreover, a low signal level indicates a logic low (in Boolean logic, a "0").

Unlike conventional binary logic having only two valid logic states (either 1 or 0) defined by a single logic path, the vector logic method of the present invention implements "vector logic." In vector logic, logic variables having greater than two valid logic states are propagated through a logic network in a monotonic progression. In other words, Boolean variables, non-Boolean variables, or both, may be represented and utilized in systems employing the vector logic method.

A "vector logic variable" V is defined as a set of i "vector logic states" encoded on a set of n logic paths. Each of the n logic paths is referred to hereafter as a "vector component" of V. Each vector component at any given time may assume one of two values: either "active" or "inactive."

The encoding of i vector logic states onto the vector logic variable V is performed in such a way as to allow the implementation of self-timed logic gates (described in detail later in this document). Each vector logic variable V is encoded with the following properties:

(a) At least one "invalid" state must exist. One invalid state is the vector logic state when all vector components of vector logic variable V are inactive. More than one invalid state may exist.

(b) i "valid" logic states are defined by a subset of m active vector components and (n-m) inactive vector components.

(c) The transition from any invalid state to any valid state must avoid a transition through any other valid state.

Encodings which obey the foregoing rules always leave one or more combinations which are neither valid or invalid. These are referred to as "illegal" states. Furthermore, a system which uses vector logic will allow transitions from an invalid state to a valid state, and vice versa. However, transitions to any illegal state, or transitions between valid states are disallowed.

As an example of the novel vector logic, consider a vector logic variable V having 3 vector components (n=3), valid vector logic states (i=3), and wherein each valid state is defined by 1 active vector component (m=1). In the vector notation used throughout this document, vector variables are denoted in bold print, vector components are enclosed within angle brackets "< >", a "0" or a "logic low" denotes an inactive vector component, and a "1" or a "logic high" denotes an active vector component. For this example, the following Table A illustrates the vector logic encoding:

TABLE A

| V | Vector Logic State |
|---|---|
| <0,0,0> | Invalid |
| <0,0,1> | V = 0 (valid state) |
| <0,1,0> | V = 1 (valid state) |
| <1,0,0> | V = 2 (valid state) |
| <1,1,1> | Illegal |
| <1,1,0> | Illegal |
| <1,0,1> | Illegal |
| <0,1,1> | Illegal |

As another example of the novel vector logic, consider a vector logic variable V having 4 vector components (n=4), 6 valid vector logic states (i=3), and wherein each valid state is defined by 2 active vector components (m=2).

TABLE B

| V | Vector Logic State |
|---|---|
| <0,0,0,0> | Invalid |
| <0,0,0,1> | Invalid |
| <0,0,1,0> | Invalid |
| <0,1,0,0> | Invalid |
| <1,0,0,0> | Invalid |
| <0,0,1,1> | V = 0 (valid state) |
| <0,1,0,1> | V = 1 (valid state) |
| <1,0,0,1> | V = 2 (valid state) |
| <0,1,1,0> | V = 3 (valid state) |
| <1,0,1,0> | V = 4 (valid state) |
| <1,1,0,0> | V = 5 (valid state) |
| <1,1,1,0> | Illegal |
| <1,1,0,1> | Illegal |
| <1,0,1,1> | Illegal |
| <0,1,1,1> | Illegal |
| <1,1,1,1> | Illegal |

The number of possible vector logic states for a logic network can be conceptually generalized by the following mathematical combination formula (n things taking m at a time):

$$i = \binom{n}{m} = \frac{n!}{m!(n-m)!}$$

where n is the set of vector components (also logic paths) which defines each vector logic variable, m is the number (or subset) of logic paths which must be active (logic high) to specify a valid vector logic state, and i is the number of possible vector logic states based on m and n. Moreover, for minimizing hardware and obtaining the greatest advantages, $m \leq (\frac{1}{2})n$.

The vector logic method has many desirable advantages. Because a plurality of valid vector logic states are possible, unlike conventional binary logic systems having only two valid states, logic evaluations can be performed in a logic network in a monotonic progression without static hazards. Furthermore, Boolean as well as non-Boolean logic variables (i.e., greater than 2 possible states) are possible to represent. This concept can be used, for example, in floating point operations for three and four valued variables, for example, in a generate/propagate/kill carry variable in a binary adder bit slice. Use of non-Boolean variables substantially reduces hardware requirements and cost as will be described relative to the novel mousetrap logic gates of FIGS. 1-8 later in this document.

Self-Timed Vector Logic

Timing information is provided, or encoded, in the critical data path in each vector logic variable in order to permit self-timed operation. In the preferred embodiment, a vector logic state is defined as "invalid" when all the associated n vector components are concurrently inactive (i.e., the n logic paths all exhibit a logic low) and is defined as "valid" when a subset m of the n vector components is active (i.e., m of n logic paths exhibit a logic high). In a sense, all of the i valid vector logic states share the same invalid states. Furthermore, validity is determined by each vector logic state itself at an instant in time, not by a clock as in a traditional clocked system.

In order to permit self-timing of monotonic vector logic, each subset m defining a particular valid vector logic state must be "nonoverlapping" relative to other subsets m defining other valid vector logic states. Said another way, the encoding for a valid vector logic state should not be wholly contained in the encoding of another valid vector logic state. For example, in the vector logic example having three logic paths (n=3) with a single logic high (m=1) on a particular logic path defining each valid vector logic state, the logic state "1,1,1" is disallowed because this would cause overlapping of valid vector logic states. "Overlapping" is defined in this document as the predicament where one valid vector logic state is a subset of, or is wholly contained in, another valid vector logic state. In the preceding example (n=3; m=1), vector logic states "0,0,1" and "0,1,0" would both be subsets of "1,1,1". As another example (n=4), a vector logic state "1,1,0,0" would be a subset of "1,1,1,0" or "1,1,1,1".

As a result of the preceding nonoverlapping requirement, it should be noted that during the operation of a self-timed vector logic network, other invalid vector logic states can exist, in addition to the state when all logic paths exhibit a logic low. In particular, when a fewer number than the requisite subset m of the n logic paths exhibit a logic high, then the vector logic state defined by the n logic paths at that instant in time is considered invalid. For example, if a vector logic system defines the state "1,1,0" as valid, then not only is "0,0,0" invalid, but "1,0,0" is invalid as well, because i<m.

If overlapping valid vector logic states were not disallowed, a logic gate would not know when an input vector is valid, and thus, when to perform a logic evaluation. The logic gate would not know whether a particular valid vector logic state (that state defined by subset i; e.g., "1,0,0") has already been achieved or whether a valid vector logic state (that state defined by subset m; e.g., "1,1,0") is still yet to be defined. By disallowing by definition overlapping valid vector logic states, glitch-free self-timing may be implemented in monotonic vector logic.

Another aspect concerning the implementation of a self-timed vector logic system is that all valid logical outcomes must be encoded. The reason is that all vector logic states share the same invalid logic state 0, . . . , 0. Hence, no assumptions can be made as to the logical outcome of a self-timed gate based receipt of other outcomes. If not all logical outcomes are encoded, then the self-timed gate, in those situations where an uncoded state is generated, cannot continue on and will wait forever.

Because timing information can be encoded in the vector logic states themselves, logic gates can be designed to operate as independent self-timed elements, thereby optimizing speed and performance. In other words, precharge signals (for example, a clock CK or NCK) can be used to precharge the logic gates implementing the vector logic method to thereby drive the gates to an invalid state, but the precharge signals need not dictate progression of the logic evaluations through cascaded logic gates. A logic evaluation can be triggered in each individual logic gate immediately when it receives a valid input vector from a preceding logic gate. Two significant features can be determined from each input vector from a preceding logic gate: (1) when the input vector is valid, thereby eliminating the need for a conventional valid clock signal, and (2) the logic value of the input vector when it is valid. Logic networks having cascaded groups of self-timed logic gates in accordance with the present invention can operate synchronously or asynchronously relative to the system clock CK and can operate at much greater speeds than the fundamental clock rate.

2. Mousetrap Logic Gate

With reference now to the figures wherein like reference numerals designate corresponding parts throughout the several views, FIG. 1 shows a novel family of "mousetrap" logic gates 100 for implementing the self-timed vector logic method of the present invention. Mousetrap logic gates, described in detail hereinafter, can implement self-timed vector logic at high speed with minimum hardware requirements, are functionally complete, and do not suffer adverse logic reactions resulting from static hazards when cascaded in series because they implement a monotonic progression.

The mousetrap logic gate 100 receives one or more vector logic inputs on the set of logic paths 102 and generates a vector logic output on the set of logic paths 132. No limit exists as to the number of possible input vectors. Further, each input vector and the output vector may be specified by any number of vector components, each vector component having a dedicated logic path.

In architecture, the mousetrap logic gate 100 has a plurality of parallel gate components 112, 114. Each gate component 112, 114 of the mousetrap logic gate 100 comprises an arming mechanism 118, ladder logic 122, and an inverting buffer mechanism 124. The number of gate components 112, 114 depends upon the logic function to be performed on the input vectors individually or as a whole, the number of desired output vector components, as well as other considerations with respect to the logical purpose of the mousetrap logic gate 100.

The arming mechanism 118 is a precharging means, or energizing means, for arming and resetting the mousetrap logic gate 100 and for driving the gate output to an invalid state. The arming mechanism 118 essentially serves as a switch to thereby selectively impose a voltage $V_0$ on a node 126 upon excitation by a precharge signal (logic high or low; synchronous or asynchronous relative to system clock CK) on node 128. In the preferred embodiments, the arming mechanism 118 is a p-channel metal-oxide-semiconductor field-effect transistor (MOSFET), which is well known in the art and is commercially available. N-channel MOSFETs could be used instead of a p-channel MOSFET; however, the switching signal obviously would be diametrically opposite. As known in the art, any type of switching element or buffer for selectively applying voltage based upon a precharge signal can be used. Furthermore, when the logic is based upon current levels, rather than voltage levels, then the arming mechanism 118 could be a switchable current source, which is also well known in the art. Any embodiment serving the described switching function as the arming mechanism 118 is intended to be incorporated herein.

The ladder logic 122 is designed to perform a logic evaluations on the one or more input vectors. The ladder logic 122 corresponding to each gate component 112, 114 may vary depending upon the purpose of each gate component 112, 114. The ladder logic 122 is essentially a combination of simple logic gates, for example, logic OR gates and/or logic AND gates, which are connected in series and/or in parallel. Preferably, the simple logic in the ladder logic 122 is implemented with n-channel MOSFETs. The rationale for using n-channel MOSFETs is as follows. The ladder logic 122 must operate at high speed because it resides in the critical logic path, unlike the arming mechanism 118 which initially acts by arming the gate component, but then sits temporarily dormant while data actually flows through the gate component, i.e., through the critical logic path. N-channel MOSFETs have superior drive capabilities, space requirements, and load specifications, than comparable p-channel MOSFETs. A typical n-channel MOSFET can generally switch approximately fifty percent faster than a comparable p-channel MOSFET having similar specifications.

Also residing in the critical logic path is the inverting buffer mechanism 124. The inverting buffer mechanism 124 primarily serves an inverter, because in order to provide complete logic functionality in the mousetrap gate 100, it is necessary to have an inversion function in the critical logic path. Moreover, the inverting buffer mechanism 124 provides high gain to the signal residing on node 126 and provides isolation between other potential stages of gate components similar to the gate components 112, 114 of FIG. 1. The inverting buffer mechanism 124 is characterized by a high input impedance and low output impedance.

Preferably, the inverting buffer mechanism 124 is implemented with a static CMOSFET inverter, which is well known in the art and is commercially available. The gain of the static CMOSFET inverter, which comprises both a p-channel MOSFET pull-up and an n-channel MOSFET pull-down, can be manipulated to optimize performance. This concept of manipulating the inverter gain is claimed and described in the patent application entitled "A FUNCTIONALLY COMPLETE FAMILY OF SELF-TIMED DYNAMIC LOGIC CIRCUITS" by Jeffry Yetter, filed Apr. 12, 1991, with Ser. No. 07/684,720, now U.S. Pat. No. 5,208,490 the disclosure of which is incorporated herein by reference.

In this regard, the gate width of the p-channel MOSFET of the CMOSFET inverter is made wider than the gate width of the associated n-channel MOSFET. Consequently, the CMOSFET inverter output 132 switches very quickly from a logic low (0; the armed state of the mousetrap logic gate 100) to a logic high (1; the unarmed state of the mousetrap logic gate 100). The speed of the CMOSFET inverter switching from a logic high to a logic low does not matter because the mousetrap gate 100 is precharged during this time period. Hence, the mousetrap logic gate 100 can be constructed to exhibit superior performance and size specifications in one direction, to thereby tremendously increase the speed of data transfer and reduce the size specifications of the mousetrap logic gate 100.

In order to understand the operation of the mousetrap logic gate 100, consider the gate component 112 for simplicity. Upon excitation by a precharge signal PS on the node 128, the arming mechanism 118 pulls up, or drives, the output 126 of the ladder logic 122 to a logic high. Concurrently, the arming mechanism 118 pulls the input at node 128 to the inverting buffer mechanism 124 to a logic high. Consequently, the corresponding vector component $O_0$ output node 132 is maintained at a logic low. In the foregoing initial condition, the mousetrap logic gate 100 can be analogized as a "mousetrap," in the traditional sense of the word, which has been set and which is waiting to be triggered by the an input vector. The gate component 112 remains in the armed predicament with its corresponding vector component 132 exhibiting a logic low, until being triggered by the ladder logic 122.

After the vector component at output node 132 is derived by the mousetrap logic gate 100, it is passed on to the next cascaded mousetrap logic gate (not shown) or to some other suitable circuit. The gate component 112 will not perform any further function until being reset, or re-armed, by the arming mechanism 118. Thus, the timing of logic evaluations performed from gate component to gate component as well as from gate to gate depends upon the encoded data itself. In other words, the logic evaluations are self-timed.

When mousetrap logic gates are cascaded together in long cascaded chains, precharging of the chains might require an undesirable lengthy amount of time. The reason is that gate components will not be able to pull their respective outputs to a logic low (invalid) until their input is pulled low. The result is that the gate components will charge in sequence from the first to the last in the cascaded chain, thereby undesirably slowing the precharge of the overall chain. Hence, a parallel precharging means is needed to cause the gate components of a cascaded chain to precharge in parallel, not in sequence. A parallel precharging means is claimed and described in the patent application entitled "A FUNCTIONALLY COMPLETE FAMILY OF SELF-TIMED DYNAMIC LOGIC CIRCUITS" by Jeffry Yetter, filed Apr. 12, 1991, with Ser. No. 07/684,720, now U.S. Pat. No. 5,208,490.

In brief, parallel precharging can be accomplished several different ways. A preferred way is to provide an n-channel MOSFET triggered by the precharge signal PS to disable the ladder logics 122 of FIG. 1 during the precharging of the gate components 112, 114. In other words, a push-pull situation is implemented. The arming mechanism of a gate component pulls (precharges) the input to the inverting buffer mechanism high, while the inserted n-channel MOSFET pulls the ladder logic low and kills the logic propagation path.

It should be noted that the n-channel MOSFET slightly slows the operation of the gate component. However, the n-channel MOSFET need not be implemented for every gate component. It need only be inserted every few cascaded gate components. Moreover, in certain logic circuits, such as multiplication, the parallelism of the logic operation may be exploited to reduce the number of requisite n-channel MOSFETs. The foregoing embodiment for providing parallel precharging has advantages. It requires little additional power dissipation. Moreover, it can, if desired, be uniformly applied to all gate components for simplicity.

Another preferred way of providing for parallel precharging of cascaded gate components is to periodically insert a mousetrap AND gate in the critical logic path. The mousetrap AND gate is input (1) an output vector component from a preceding gate component and (2) the precharge signal PS. The output of the mousetrap AND gate is input to the next cascaded gate component.

Specific examples of possible mousetrap logic gates are now described hereafter. These examples are intended to serve as instructional materials and to illustrate the many advantages of the present invention over the prior art. It should be understood that the list of examples set forth is by no means exhaustive and a multitude of other mousetrap logic gates are possible in light of these novel teachings.

EXAMPLE 1

Figure 2:
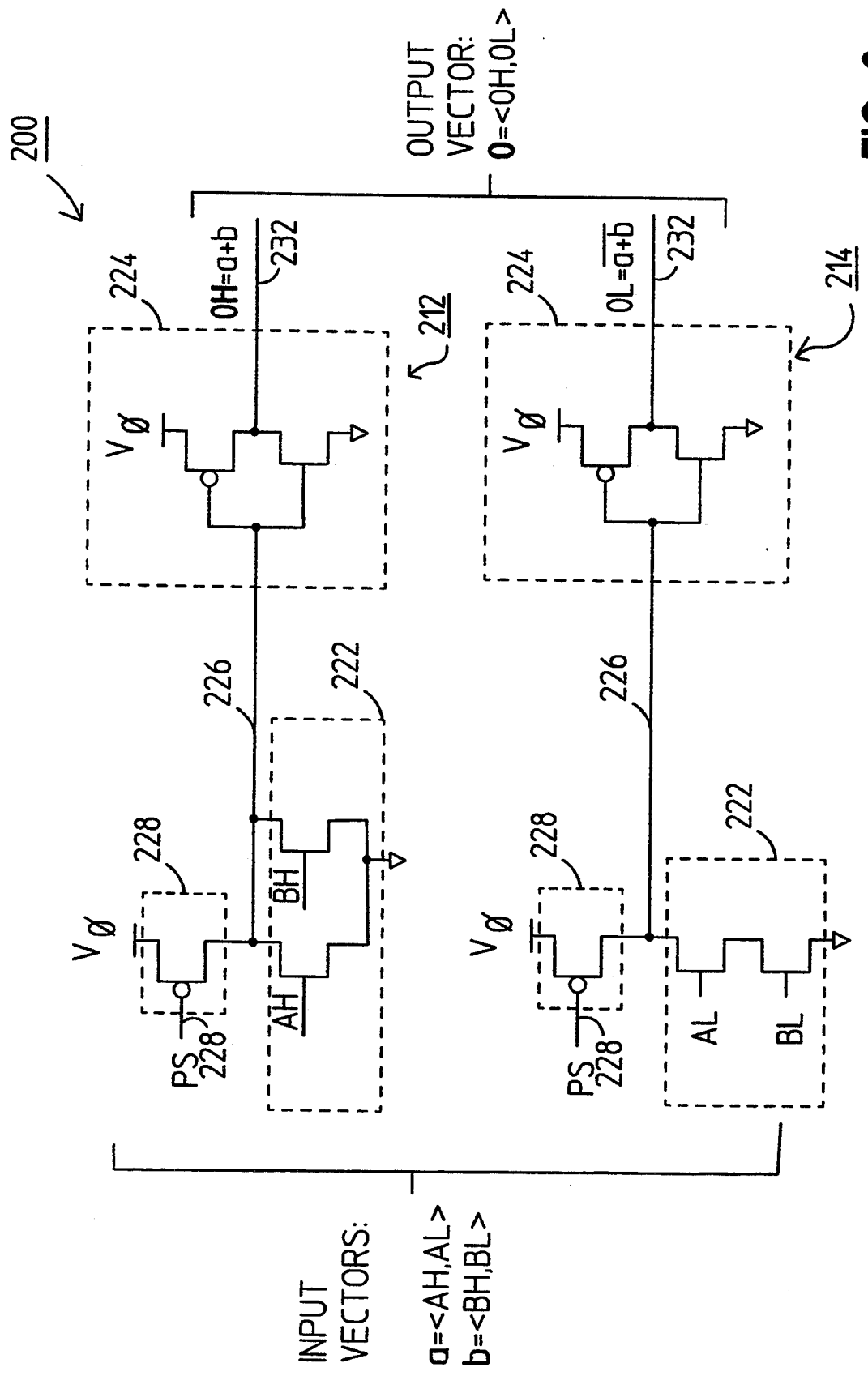
FIG. 2 is a block diagram of an inclusive-OR mousetrap logic gate in accordance with FIG. 1.

FIG. 2 shows a simple specific example of a mousetrap logic gate 100 in accordance with FIG. 1. As shown in FIG. 2, an inclusive-OR mousetrap logic gate 200 can be derived and used in a self-timed vector logic system having input vectors and outputs with two valid logic states and one invalid logic state. U.S. Pat. No. 4,570,084 to Griffin et al. teaches a dual-rail logic gate similar to that shown in FIG. 2, but the Griffin gate fails to teach the use of an invalid logic state and thus self-timing in the dual-rail logic system, and fails to teach the use of non-Boolean variables, i.e., the use of vector logic states having greater than two valid logic states.

The inclusive-OR mousetrap logic gate 200 has two parallel gate components 212, 214. Each gate component 212, 214 comprises an arming mechanism 228, a ladder logic 222, and an inverting buffer mechanism 224. The inclusive-OR mousetrap logic gate 200, and specifically, the arming mechanisms 228, are precharged by placing a charge Q on nodes 226. The arming mechanisms 226 are shown as p-channel MOSFETs, which are active at logic low. Moreover, the simple logic in the ladder logics 222 is implemented with n-channel MOSFETs, and the inverting buffer mechanisms 224 are static CMOSFET inverters.

A truth table for the inclusive-OR mousetrap logic gate 200 is set forth in Table C hereinafter. In the various tables and text of this document, "x" denotes an irrelevant or "don't care" situation and "inv" denotes an invalid vector logic state.

TABLE C

| VECTOR INPUTS | | VECTOR OUTPUT | INPUT VECTOR COMPONENTS | | | | OUTPUT VECTOR COMPONENTS | |
|---|---|---|---|---|---|---|---|---|
| a | b | O | AH | AL | BH | BL | OH | OL |
| inv | inv | inv | 0 | 0 | 0 | 0 | 0 | 0 |
| inv | 0 | inv | 0 | 0 | 0 | 1 | 0 | 0 |
| 0 | inv | inv | 0 | 1 | 0 | 0 | 0 | 0 |
| 1 | x | 1 | 1 | 0 | x | x | 1 | 0 |
| x | 1 | 1 | x | x | 1 | 0 | 1 | 0 |

As indicated in Table C and shown in FIG. 2, an input vector a and an input vector b are operated upon by the inclusive-OR mousetrap logic gate 200 to derive an output vector O. It is worth noting that input vector a, input vector b, and output vector O could correspond respectively with input vector I, input vector J, and output vector O of FIG. 1.

In this example, the input vector a is a Boolean input variable and is defined by two input vector components AH, AL on two respective logic paths. The input vector b is also a Boolean input variable and is defined by the two input vector components BH, BL on two respective logic paths. Further, the output vector O is also a Boolean variable and is defined by two output vector components OH, OL on two logic paths. The output vector O is the result of the inclusive disjunction (OR function) of input vectors a, b. In vector notation, as shown in FIG. 2, $a = <AH,AL>$; $b = <BH,BL>$; and $O = <OH,OL> = a+b$.

EXAMPLE 2

Figure 3:
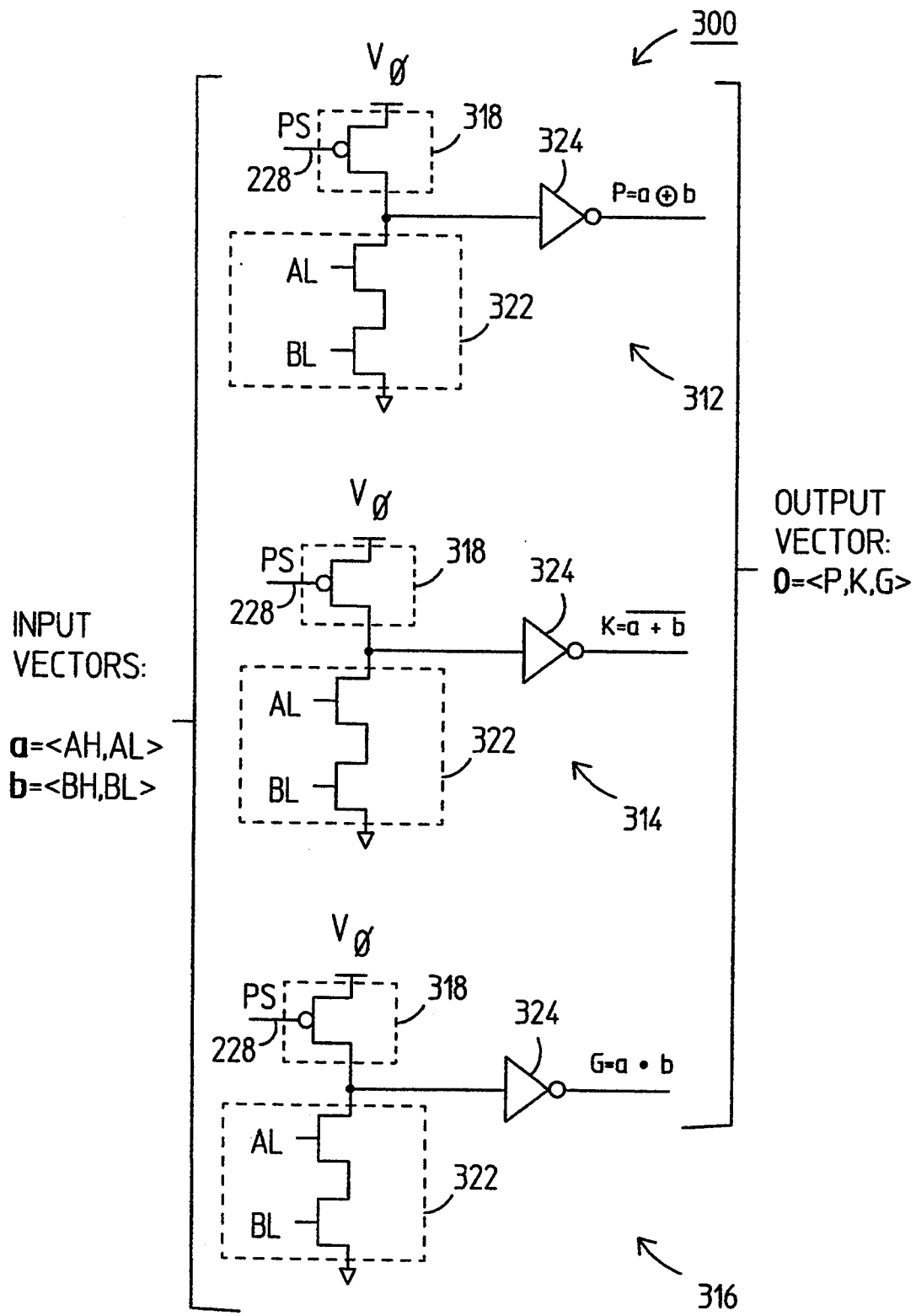
FIG. 3 is a block diagram of an add predecoder logic gate in accordance with FIG. 1.

An add predecoder logic gate 300 is shown in FIG. 3. Well known in the art, an add predecoder is logic primarily used in an arithmetic logic unit (ALU) to perform mathematical functions, especially addition. Generally, an add predecoder aids in parallel processing and facilitates control of a carry bit path.

In structure, the add predecoder logic gate 300 of FIG. 3 has three parallel gate components 312, 314, 316. Each gate component 312, 314, 316 comprises an arming mechanism 318, a ladder logic 322, and an inverting buffer mechanism 324. A truth table describing the operation of the add predecoder logic gate 300 is set forth in Table D hereinafter.

TABLE D

| VECTOR INPUTS | | VECTOR OUTPUT | INPUT VECTOR COMPONENTS | | | | OUTPUT VECTOR COMPONENTS | | |
|---|---|---|---|---|---|---|---|---|---|
| a | b | O | AH | AL | BH | BL | P | K | G |
| inv | x | inv | 0 | 0 | x | x | 0 | 0 | 0 |
| x | inv | inv | x | x | 0 | 0 | 0 | 0 | 0 |
| 0 | 0 | kill | 0 | 1 | 0 | 1 | 0 | 1 | 0 |
| 0 | 1 | prop | 0 | 1 | 1 | 0 | 1 | 0 | 0 |
| 1 | 0 | prop | 1 | 0 | 0 | 1 | 1 | 0 | 0 |
| 1 | 1 | gen | 1 | 0 | 1 | 0 | 0 | 0 | 1 |

Similar to the inclusive-OR mousetrap logic gate 200 of FIG. 2, an input vector a is defined by two vector components AH, AL, and an input vector b is defined by two other vector components BH, BL. However, in contrast to the mousetrap logic gate of FIG. 2, output vector O is defined by a non-Boolean vector variable $<P,K,G>$ having three possible states P, K, G defined on three logic paths. In vector notation, as shown in FIG. 3, $a = <AH,AL>$; $b = <BH,BL>$; and $O = <P,K,G>$, where vector component $P = a \oplus b$, where vector component $K = -(a+b)$, and where vector component $G = a+b$.

Due to binary Boolean logic limitations, conventional add predecoder logic gates are usually designed so that the output indicates only one of two logic states. In many implementations, the conventional predecoder indicates either that the carry should be "propagated" (P) or that the carry bit should be "killed" (K). In other implementations, the predecoder indicates either that the carry should be "propagated" or that the carry bit should be "generated" (G). Neither of the preceding implementations can be operated in a self-timed manner because there must be an encoding for all outcomes in a self-timed system, as discussed previously, because all logic states in a self-timed system share the same invalid state "0, ..., 0".

As noted in Table D above, the non-Boolean output vector O can indicate an invalid state or any of three valid states, namely, kill, propagate, or generate, at any instant in time. Worth noting is that if a dual-rail logic system were implemented, such as that described in U.S. Pat. No. 4,570,084 to Griffin et al., at least four mousetrap gate components (not shown) would need to be implemented to specify an invalid state and the three valid states. For instance, in the hypothetical dual-rail system, each of the four gate components could output one of P, $-P$, K, and $-K$. The state of G and $-G$ could be determined by performing subsequent logic functions: $G = (-P)(-K)$ and $-G = P + K$. Moreover, the invalid state could be defined when all P, $-P$, K, and $-K$ exhibit a logic low. However, as mentioned, such a system would include more hardware than the present invention and much more when vectors having a greater number of possible valid states are employed. Further, using the novel vector logic method significantly saves hardware when logic gates are used on a mass scale, such as in the design of a processor.

Also worth noting is that the add predecoder logic gate 300 must perform an exclusive-OR logic function as part of the overall predecoder logic function. Conventionally, dynamic logic gates could not implement the exclusive-OR function because static hazards would cause logic errors. Static hazards occur in combinational logic configurations because of propagation time delays. The mousetrap logic gates of the present invention are not adversely affected by static hazards.

EXAMPLE 3

Figure 4:
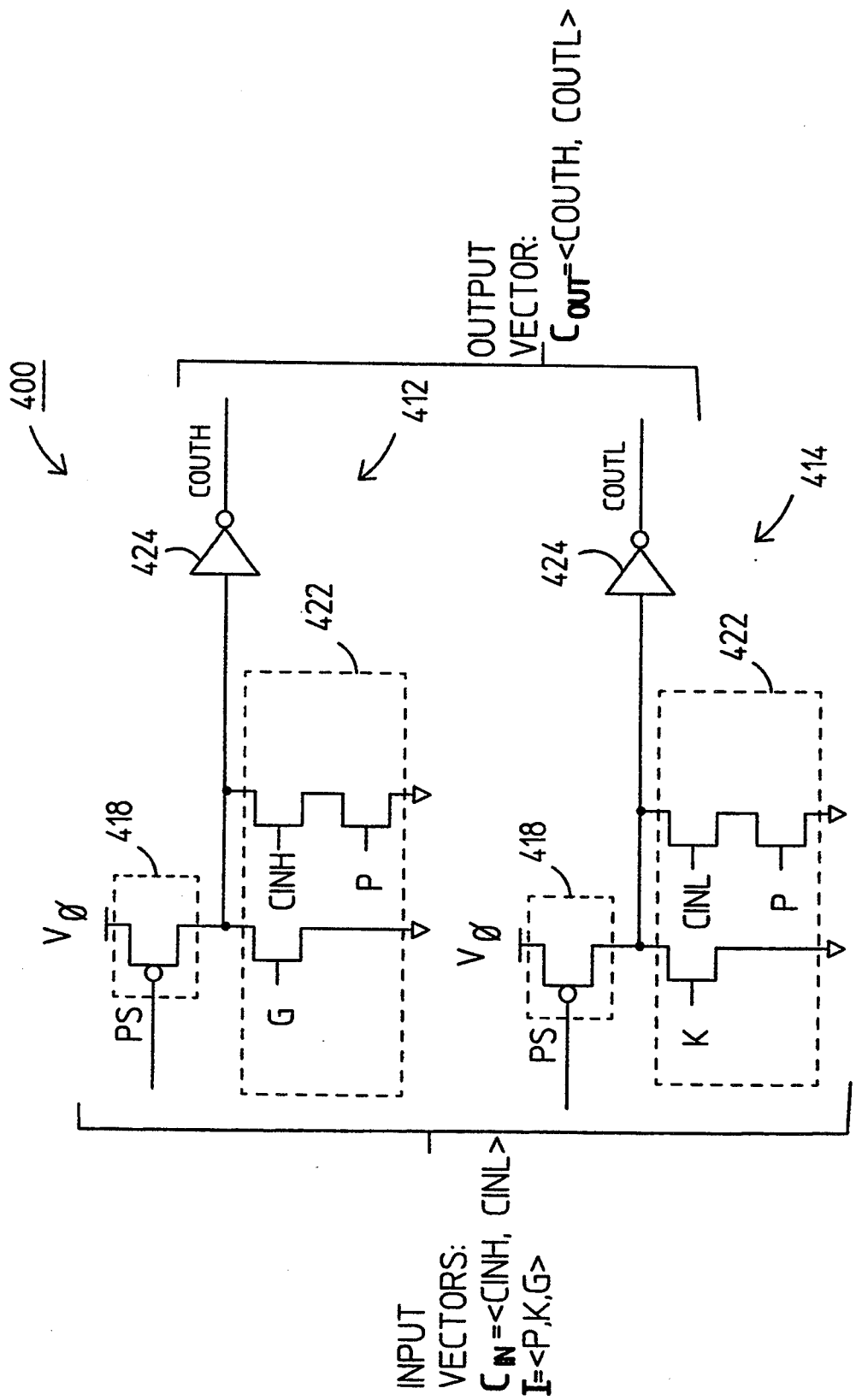
FIG. 4 is a block diagram of a carry propagate logic gate in accordance with FIG. 1 for cascading with the add predecoder logic gate of FIG. 3.

A carry propagate gate 400 is shown in FIG. 4. Well known in the art, a carry propagate logic gate is oftentimes cascaded with an add predecoder logic gate, as discussed previously relative to FIG. 3, in order to provide a high performance carry bit path in an ALU. The carry propagate gate 400 of FIG. 4 has two gate components 422, 424, each comprising an arming mechanism 418, ladder logic 422, and an inverting buffer mechanism 424. A truth table for the carry propagate gate 400 is set forth in Table E hereinafter.

TABLE E

| VECTOR INPUTS | | VECTOR OUTPUT | INPUT VECTOR COMPONENTS | | | | | OUTPUT VECTOR COMPONENTS | |
|---|---|---|---|---|---|---|---|---|---|
| I | CIN | COUT | P | K | G | CINH | CINL | COUTH | COUTL |
| inv | x | inv | 0 | 0 | 0 | x | x | 0 | 0 |
| x | inv | inv | x | x | x | 0 | 0 | 0 | 0 |
| kill | x | 0 | 0 | 1 | 0 | x | x | 0 | 1 |
| prop | 0 | 0 | 1 | 0 | 0 | 0 | 1 | 0 | 1 |
| prop | 1 | 1 | 1 | 0 | 0 | 1 | 0 | 1 | 0 |
| gen | x | 1 | 0 | 0 | 1 | x | x | 1 | 0 |

As indicated in Table E above and as illustrated in FIG. 4, the carry propagate gate 400 has two input vectors I, CIN and an output vector COUT. The input vector I is a non-Boolean variable defined by the vector components P,K,G on three respective logic paths. Input vector I can exhibit an invalid state (P,K,G=0,0,0) or any of three valid vector logic states: generate→P,K,G=0,0,1; kill→0,1,0; and generate→1,0,0) at an instant in time. Further, a binary input vector CIN is defined by two vector components CINH, CINL, and the binary output vector COUT is defined by two vector components COUTH, COUTL.

EXAMPLE 4

Figure 5:
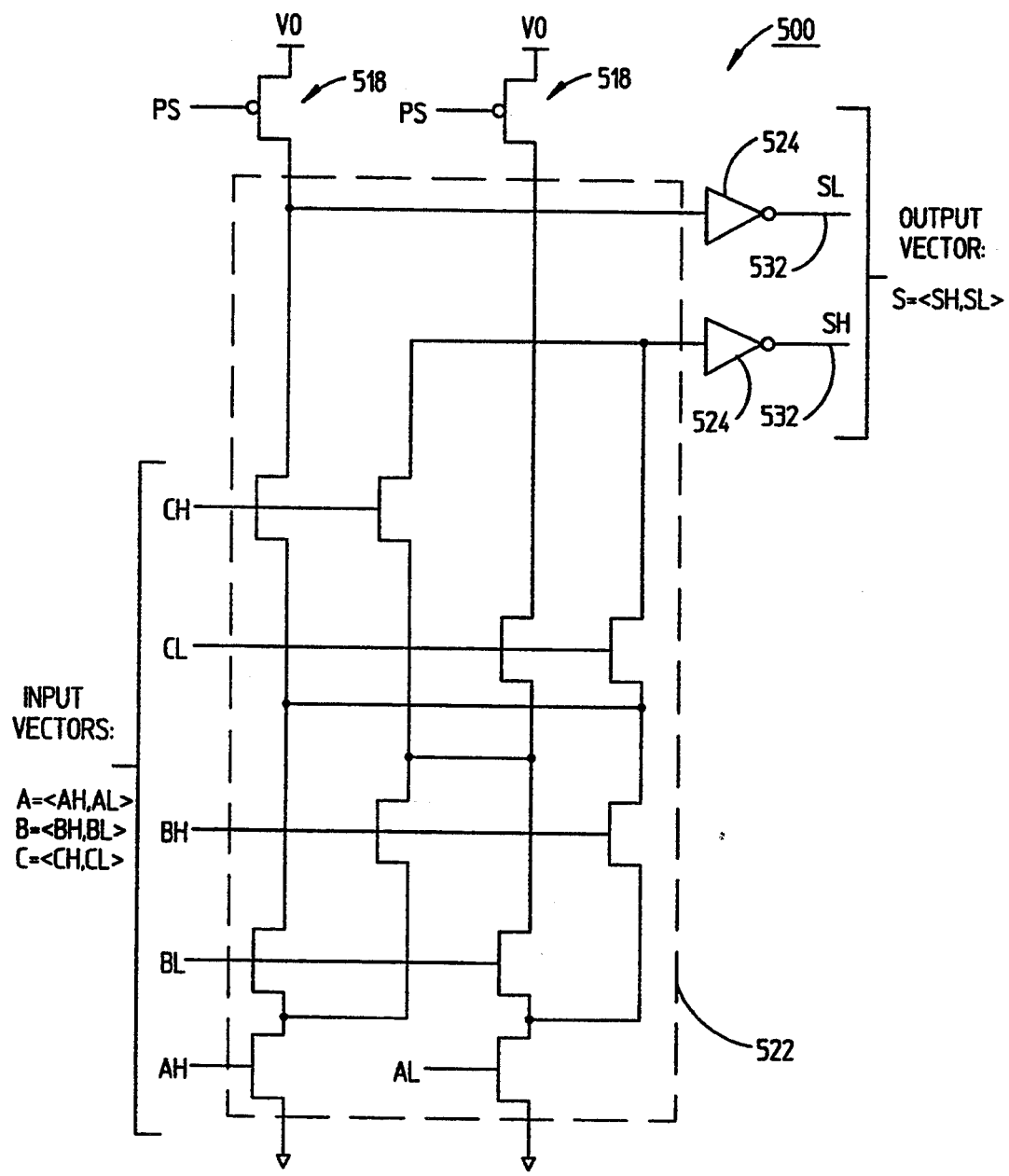
FIG. 5 is a block diagram of an exclusive-OR mousetrap logic gate in accordance with FIG. 1, wherein the exclusive-OR mousetrap logic gate can be used for sum generation in a full adder.

A three-input exclusive-OR mousetrap logic gate 500 is shown in FIG. 5. The exclusive-OR mousetrap logic gate 500 can be used for high speed sum generation in, for example, a full or half adder and does not suffer from any adverse effects from static hazards. Sum generation logic gates are especially useful in adder and multiplier logic circuits.

The exclusive-OR logic gate 500 has two gate components 512, 514, each having an arming mechanism 518 and an inverting buffer mechanism 524. However, as shown by a phantom block 522, the ladder logic associated with each of the two gate components 512, 514 is not separated completely in hardware, but remains mutually exclusive in a logic sense. Hence, as a general proposition, because the ladder logic in each gate component of a mousetrap logic gate uses the same type of transistors, namely, n-channel MOSFETs, their logic functions can share the same hardware, thereby resulting in fewer total gates and less consumed area.

A truth table indicating the operation of the exclusive-OR logic gate 500 is set forth in Table F hereinafter.

TABLE F

| VECTOR INPUTS | | | VECTOR OUTPUT | INPUT VECTOR COMPONENTS | | | | | | OUTPUT VECTOR COMPONENTS | |
|---|---|---|---|---|---|---|---|---|---|---|---|
| a | b | c | s | AH | AL | BH | BL | CH | CL | SH | SL |
| inv | x | x | inv | 0 | 0 | x | x | x | x | 0 | 0 |
| x | inv | x | inv | x | x | 0 | 0 | x | x | 0 | 0 |
| x | x | inv | inv | x | x | x | x | 0 | 0 | 0 | 0 |
| 0 | 0 | 0 | 0 | 0 | 1 | 0 | 1 | 0 | 1 | 0 | 1 |
| 0 | 0 | 1 | 1 | 0 | 1 | 0 | 1 | 1 | 0 | 1 | 0 |
| 0 | 1 | 0 | 1 | 0 | 1 | 1 | 0 | 0 | 1 | 1 | 0 |
| 0 | 1 | 1 | 0 | 0 | 1 | 1 | 0 | 1 | 0 | 0 | 1 |
| 1 | 0 | 0 | 1 | 1 | 0 | 0 | 1 | 0 | 1 | 1 | 0 |
| 1 | 0 | 1 | 0 | 1 | 0 | 0 | 1 | 1 | 0 | 0 | 1 |
| 1 | 1 | 0 | 0 | 1 | 0 | 1 | 0 | 0 | 1 | 0 | 1 |
| 1 | 1 | 1 | 1 | 1 | 0 | 1 | 0 | 1 | 0 | 1 | 0 |

As indicated in the preceding Table F and shown in FIG. 5, input vector a is defined by two vector components AH, AL. Input vector b is defined by two vector components BH, BL. Input vector c is defined by two vector components CH, CL. Furthermore, output vector s is defined by two outputs SH, SL. In vector notation, as shown, a=<AH,AL>; b=<BH,BL>; c=<CH,CL>; and s=<SH,SL>=a⊕b⊕c.

EXAMPLE 5

Figure 6:
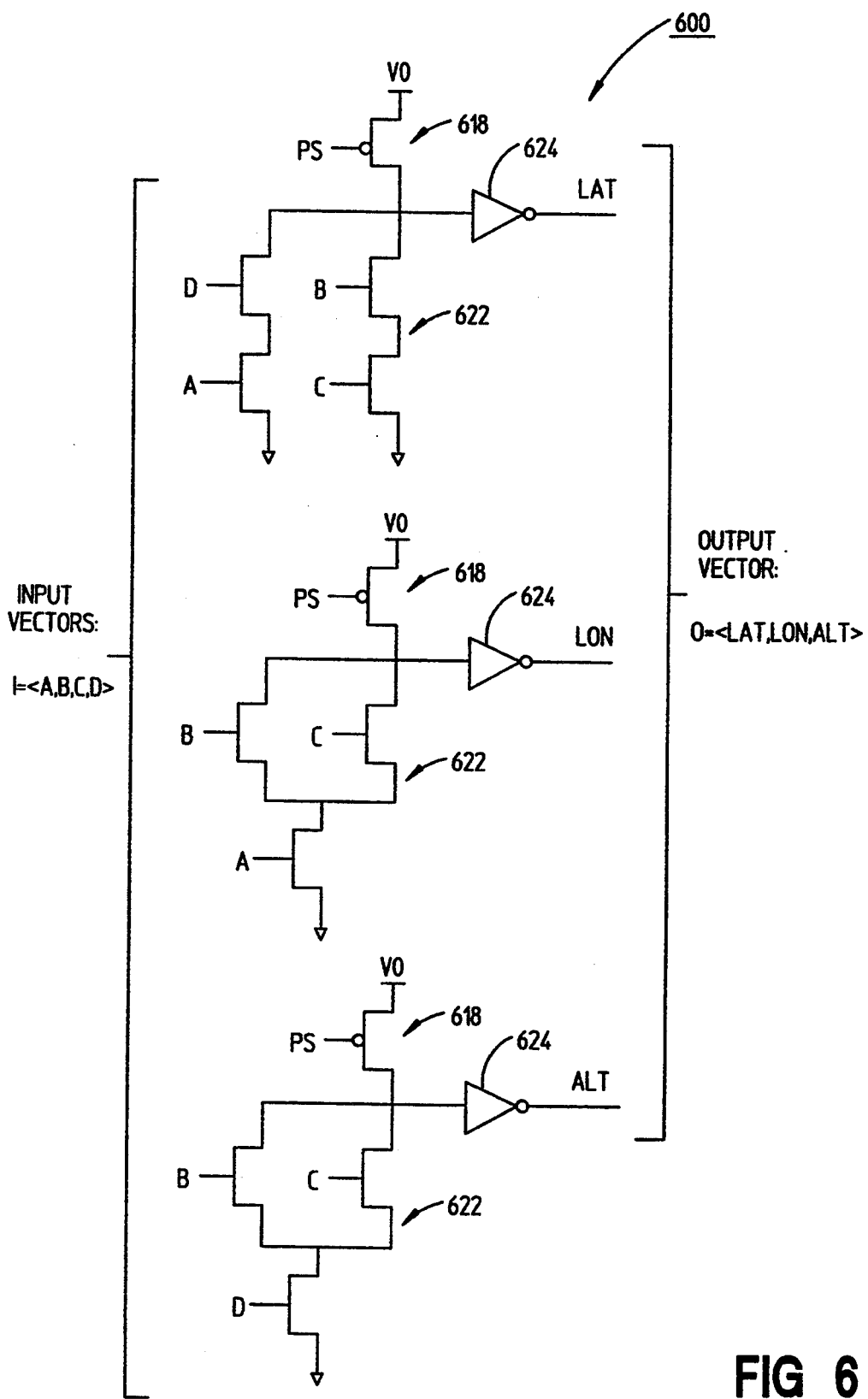
FIG. 6 is a block diagram of a direction mousetrap logic gate in accordance with FIG. 1.

Consider an example of a mousetrap logic gate 600, as shown in FIG. 6, for determining direction. The mousetrap logic gate 600 operates on a non-Boolean input vector I having six possible valid states (north (N), south (S), east (E), west (W), up (U), down (D)) encoded on four logic paths with corresponding vector components <a,b,c,d>. The gate 600 derives a non-Boolean output vector O having three possible valid states (latitude (LAT), longitude (LON), altitude (ALT)) encoded on three logic paths having corresponding vector components <LAT, LON, ALT>. A truth table for the mousetrap logic gate 600 is set forth in Table G hereinafter.

TABLE G

| VECTOR INPUT | VECTOR OUTPUT | INPUT VECTOR COMPONENTS | | | | OUTPUT VECTOR COMPONENTS | | |
|---|---|---|---|---|---|---|---|---|
| I | O | a | b | c | d | LAT | LON | ALT |
| inv | inv | 0 | 0 | 0 | 0 | 0 | 0 | 0 |
| N | LON | 1 | 1 | 0 | 0 | 0 | 1 | 0 |
| S | LON | 1 | 0 | 1 | 0 | 0 | 1 | 0 |
| E | LAT | 1 | 0 | 0 | 1 | 1 | 0 | 0 |
| W | LAT | 0 | 1 | 1 | 0 | 1 | 0 | 0 |
| U | ALT | 0 | 1 | 0 | 1 | 0 | 0 | 1 |
| D | ALT | 0 | 0 | 1 | 1 | 0 | 0 | 1 |

As indicated in Table G, the non-Boolean input vector I is defined by vector components on four input logic paths a, b, c, d, and has six possible valid vector logic states N, S, E, W, U, D. Worth noting is that the input vector I is defined by a logic high arising on two of the four logic paths a, b, c, d at an instant in time, as indicated in Table G.

Furthermore, the non-Boolean output vector O is generated by the gate 600 and is defined by vector components on three logic paths and has three possible valid vector logic states LAT, LON, ALT. However, unlike the input vector I, the output vector O is defined by a logic high on only one of the three output logic paths, as further indicated in Table G above. Moreover, in table for the mousetrap logic gate 700c is set forth in Table H hereinafter.

TABLE H

| VECTOR INPUTS | | | VECTOR OUTPUTS | INPUT VECTOR COMPONENTS | | | | | | OUTPUT VECTOR COMPONENTS | | | |
|---|---|---|---|---|---|---|---|---|---|---|---|---|---|
| y2 | y1 | y0 | Op | y2H | y2L | y1H | y1L | y0H | y0L | a4 | a3 | a2 | a1 |
| inv | inv | inv | inv | 0 | 0 | 0 | 0 | 0 | 0 | 0 | 0 | 0 | 0 |
| 0 | 0 | 0 | +0 | 0 | 1 | 0 | 1 | 0 | 1 | 0 | 0 | 1 | 1 |
| 0 | 0 | 1 | +X | 0 | 1 | 0 | 1 | 1 | 0 | 0 | 1 | 0 | 1 |
| 0 | 1 | 0 | +X | 0 | 1 | 1 | 0 | 0 | 1 | 0 | 1 | 0 | 1 |
| 0 | 1 | 1 | +2X | 0 | 1 | 1 | 0 | 1 | 0 | 0 | 1 | 1 | 0 |
| 1 | 0 | 0 | −2X | 1 | 0 | 0 | 1 | 0 | 1 | 1 | 0 | 1 | 0 |
| 1 | 0 | 1 | −X | 1 | 0 | 0 | 1 | 1 | 0 | 1 | 0 | 0 | 1 |
| 1 | 1 | 0 | −X | 1 | 0 | 1 | 0 | 0 | 1 | 1 | 0 | 0 | 1 |
| 1 | 1 | 1 | −0 | 1 | 0 | 1 | 0 | 1 | 0 | 1 | 1 | 0 | 0 |

Boolean arithmetic, LON=ab+ac, LAT=ad+bc, ALT=bd+cd, and in vector logic, O=function(I)-=<LON,LAT,ALT>=function(<N,S,E,W,U,D>).

It should be emphasized that the mousetrap logic gate 600 of FIG. 6 has only a single input vector I and only a single output vector O. A logic gate performing traditional binary logic or binary decomposition (e.g., dual-rail system) would have no need for a logic gate for performing a logic evaluation on a single logic state to derive another logic state. Needless to say, an inversion is a logic function which would need to be performed in such systems, but this is generally not necessary because inversions can be performed other more efficient ways. Accordingly, such an inverting logic gate, if derived, would be degenerative. Hence, in a single mousetrap logic gate of the present invention, a sophisticated logic function having substantive meaning can be performed on a single logic vector to derive another single logic vector.

EXAMPLE 6

Figure 7A:
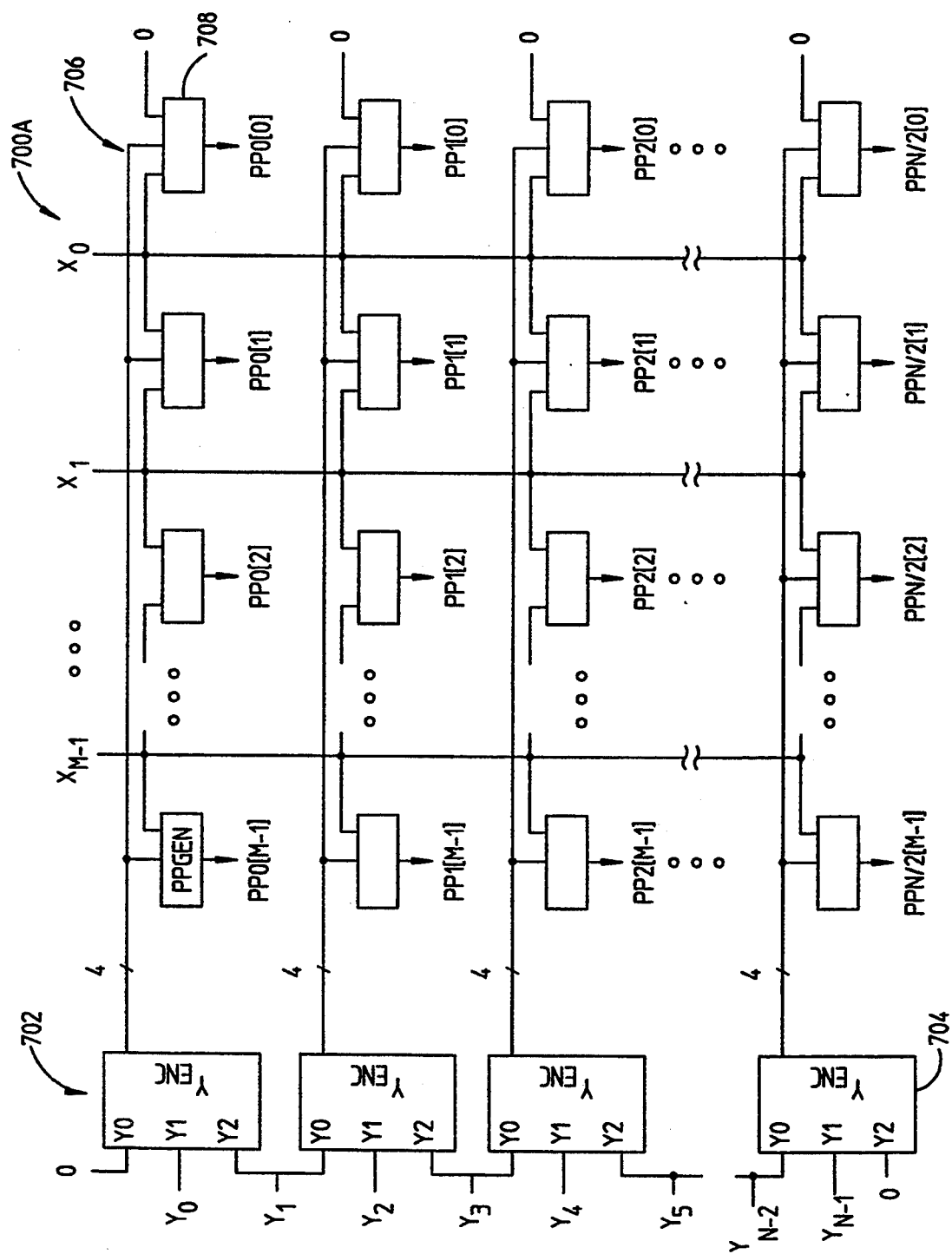
FIG. 7A is a block diagram showing Booths algorithm for generating partial products in multiplication.

In another example of the present invention relative to FIGS. 7A–7E, a mousetrap logic gate performs the well known Booths algorithm, which is commonly used for generating partial products in multiplication. For a discussion of Booths algorithm, see "Introduction to Computer Arithmetic," Waser and Flynn, pages 132–136. The architecture of a two-bit Booth encoder is shown in FIG. 7A. With reference to FIG. 7A, the Booth architecture 700a comprises two parts: (1) a column 702 of Y-encoders (Yenc) 704 and (2) an array 706 of partial product generators (PPgen) 708. Each Y-encoder 704 examines three bits of the Y-operand and generates one of six possible operation codes (Op). The array 706 of partial product generators 708 combines operation codes and the x-operand to produce an array of partial products (PP) which sum to the correct multiplication result.

Figure 7B:
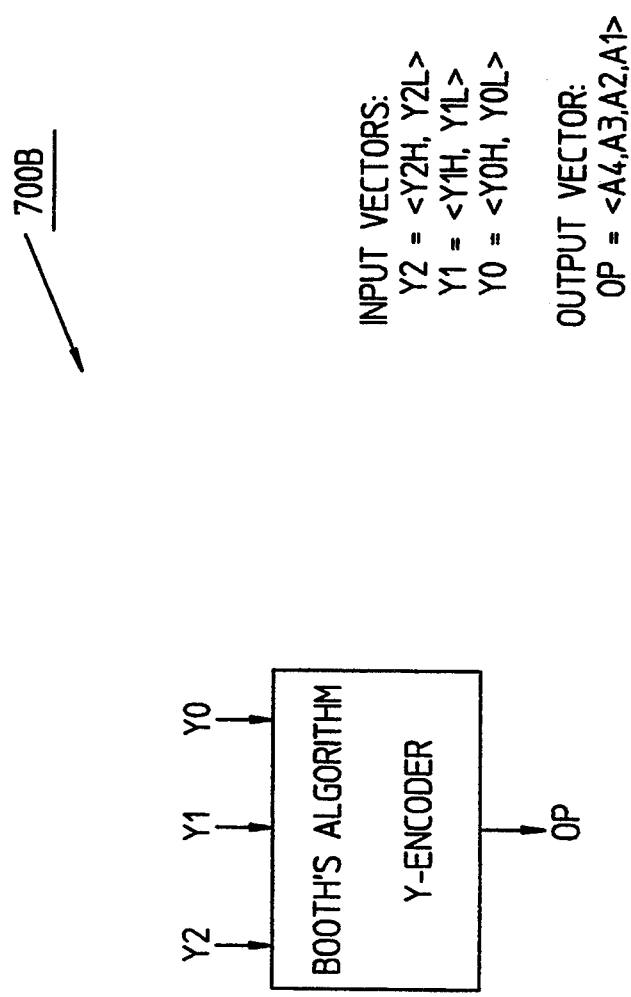
FIG. 7B is a block diagram of a Y encoder mousetrap logic gate in accordance with FIG. 1 for Booths algorithm of FIG. 7A.
Figure 7C:
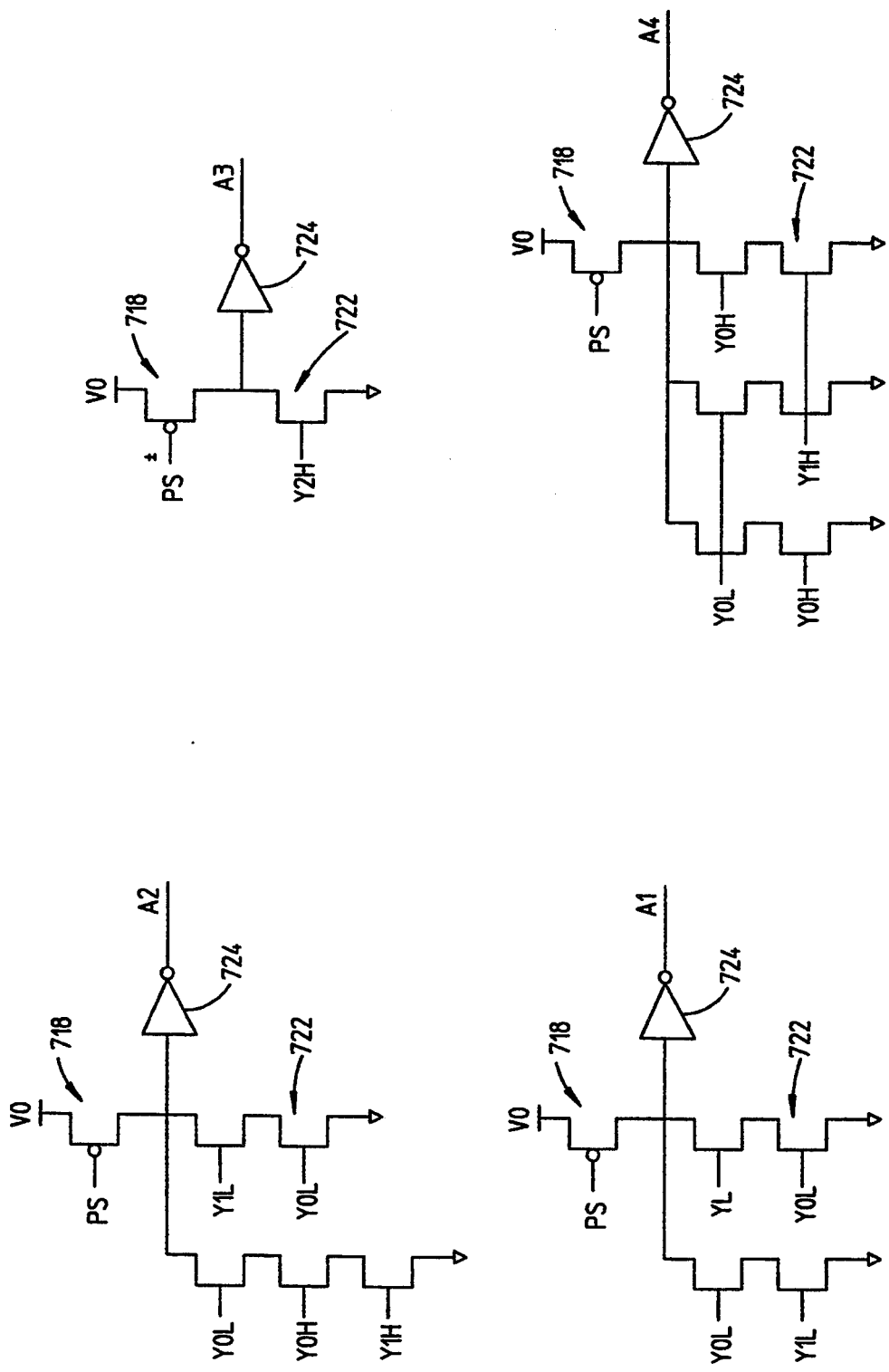
FIG. 7C is a block diagram of a mousetrap logic gate in accordance with FIG. 1 for providing a partial product generator (PPgen) of FIG. 7A.

A high level block diagram 700b illustrating a Booth's algorithm Y-encoder in accordance with the present invention is shown in FIG. 7B. Corresponding with the block diagram 700b, a mousetrap logic circuit 700c for the Y-encoder is shown in FIG. 7C. The mousetrap logic gate 700c operates on three binary input vectors y0, y1, y2 encoded on six logic paths with respective vector components y2H, y2L; y1H, y1L; y0H, y0L. Further, the gate 700c derives a non-Boolean output vector Op, which encodes the six operation codes (+0, +X, +2X, −2X, −X, −0) on four logic paths with corresponding vector components a1, a2, a3, a4. A truth In vector logic, Op=<a4, a3, a2, a1>=function(y2, y1, y0)=function (<y2H, y2L>, <y1H, y1L>, <y0H, y0L>). In Boolean arithmetic, a2=(−y1) (−y0)+(−y2) (y0) (y1); a1=(−y2) (−y1)+(y1) (−y2); a3=y2; and a4=(−y2) (y0)+(−y2) (y1)+(y1)-(y0).

The advantages of the Y-encoder of the present invention over the prior art is well apparent. More specifically, because six operation codes are possible, three bits would be required to encode all operation codes in a conventional Boolean binary system. Moreover, hypothetically, in a self-timed dual-rail system, six logic paths would be required. However, in accordance with a self-timed vector logic method of the present invention, only four logic paths are necessary in the Y-encoder.

Figure 7D:
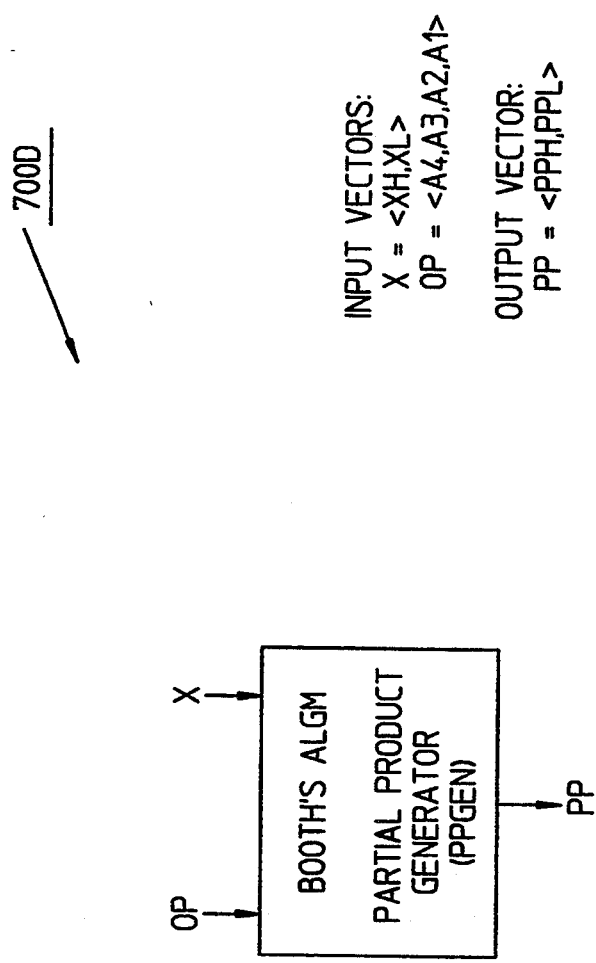
FIGS. 7D–7F are a block diagram and circuit diagrams of alternative embodiments of FIG. 7C.
Figure 7E:
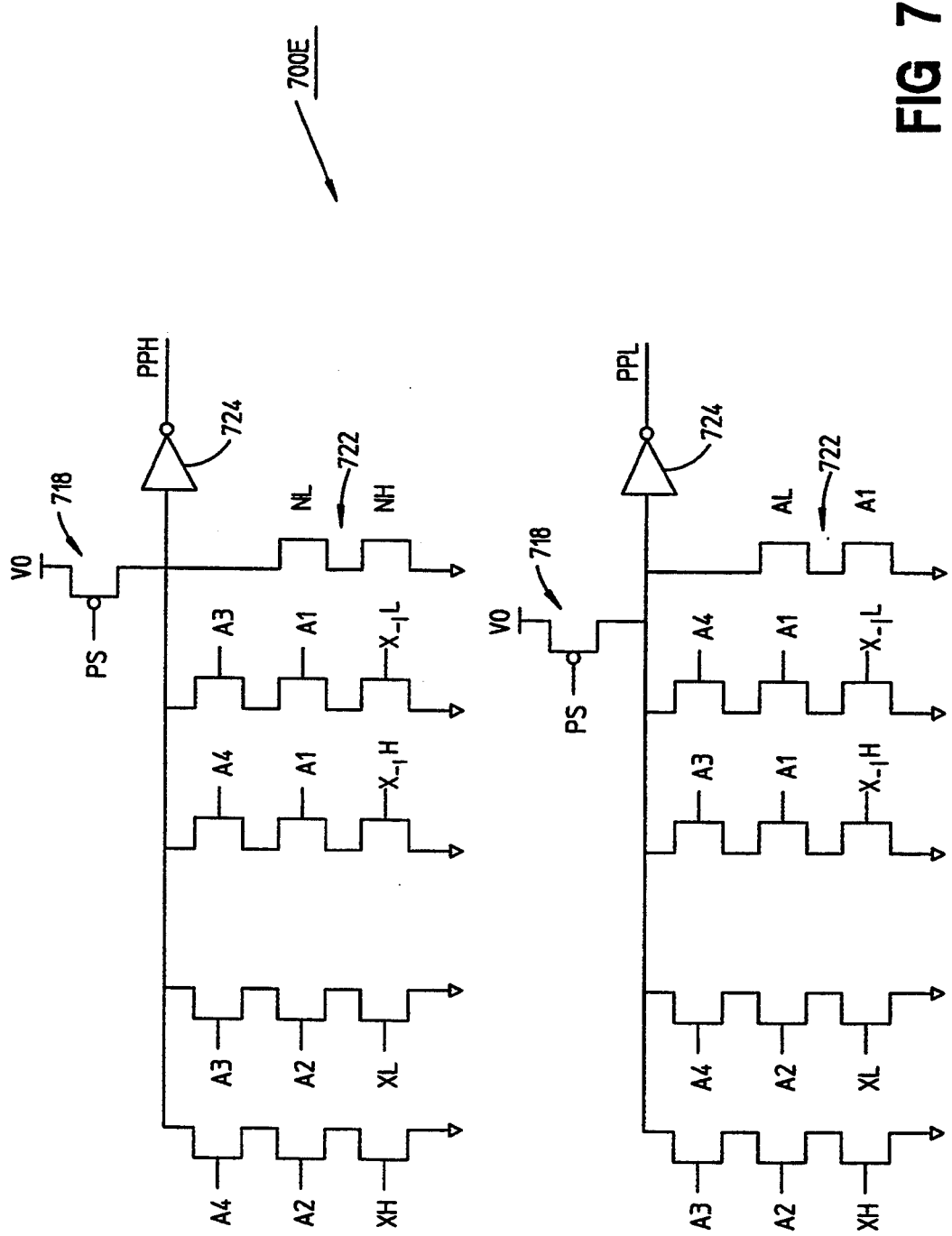

A high level block diagram 700d illustrating a Booth's algorithm PPgen in accordance with the present invention is shown in FIG. 7D. Corresponding with the block diagram 700d, a specific PPgen mousetrap logic gate 700e of FIG. 7E generates a partial product vector PP=<PPH, PPL> from the non-Boolean vector Op=<a4, a3, a2, a1> having six possible valid logic states (i.e., +0, +X, +2X, −2X, −X, −0) defined on four logic paths and an x operand x=<xH, xL> having two possible valid logic states defined on two logic paths.

As discussed hereinbefore relative to self-timed vector logic, as a result of the requirement for nonoverlapping vectors, other invalid vector logic states can exist, in addition to the state when all logic paths exhibit a logic low. As an instance of this concept in the preceding example 6, consider the output vector Op. When only a single path of the plurality of logic paths defining output vector Op exhibits a logic high, the output vector Op is invalid. In other words, when Op=<a4, a3, a2, a1> equals any of <0,0,0,1> or <0,0,1,0> or <0,1,0,0> or <1,0,0,0>, the output vector Op is invalid, in addition to the invalid logic state where Op=<0,0,0,0>.

Figure 7F:
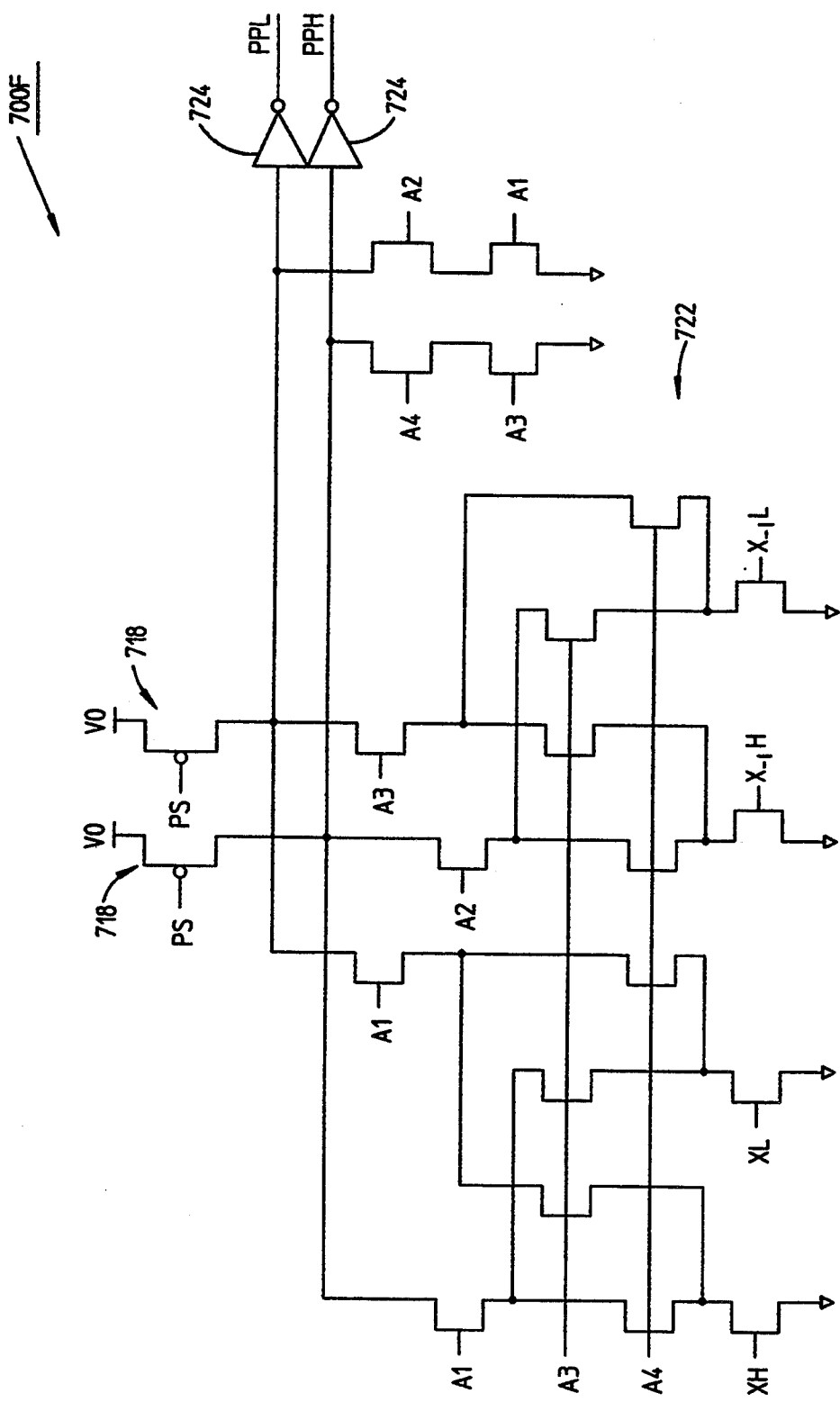

An alternative embodiment for the PPgen mousetrap logic gate 700e is shown in FIG. 7F. In FIG. 7F, an alternative PPgen mousetrap logic gate 700f combines common logic paths in the ladder logic 722 in order to minimize hardware requirements in the ladder logic 722, as was discussed relative to mousetrap logic gate 500 of FIG. 5. However, the same logic evaluations are performed in the mousetrap logic gates 700e, 700f.

EXAMPLE 7

Figure 8A:
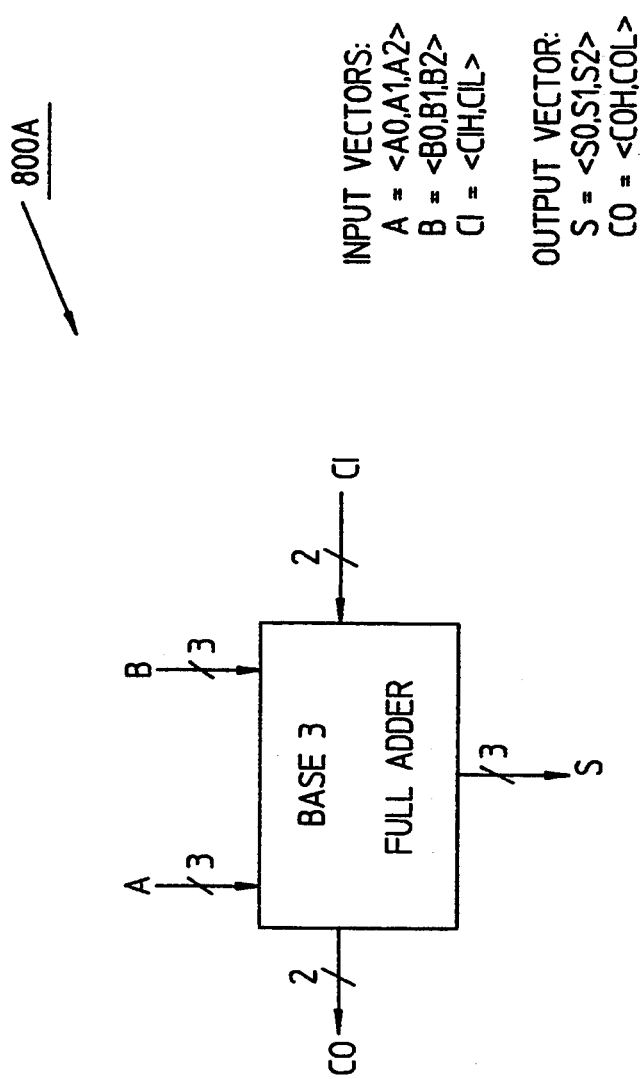
FIG. 8A is a block diagram of a ternary ripple carry adder.
Figure 8B:
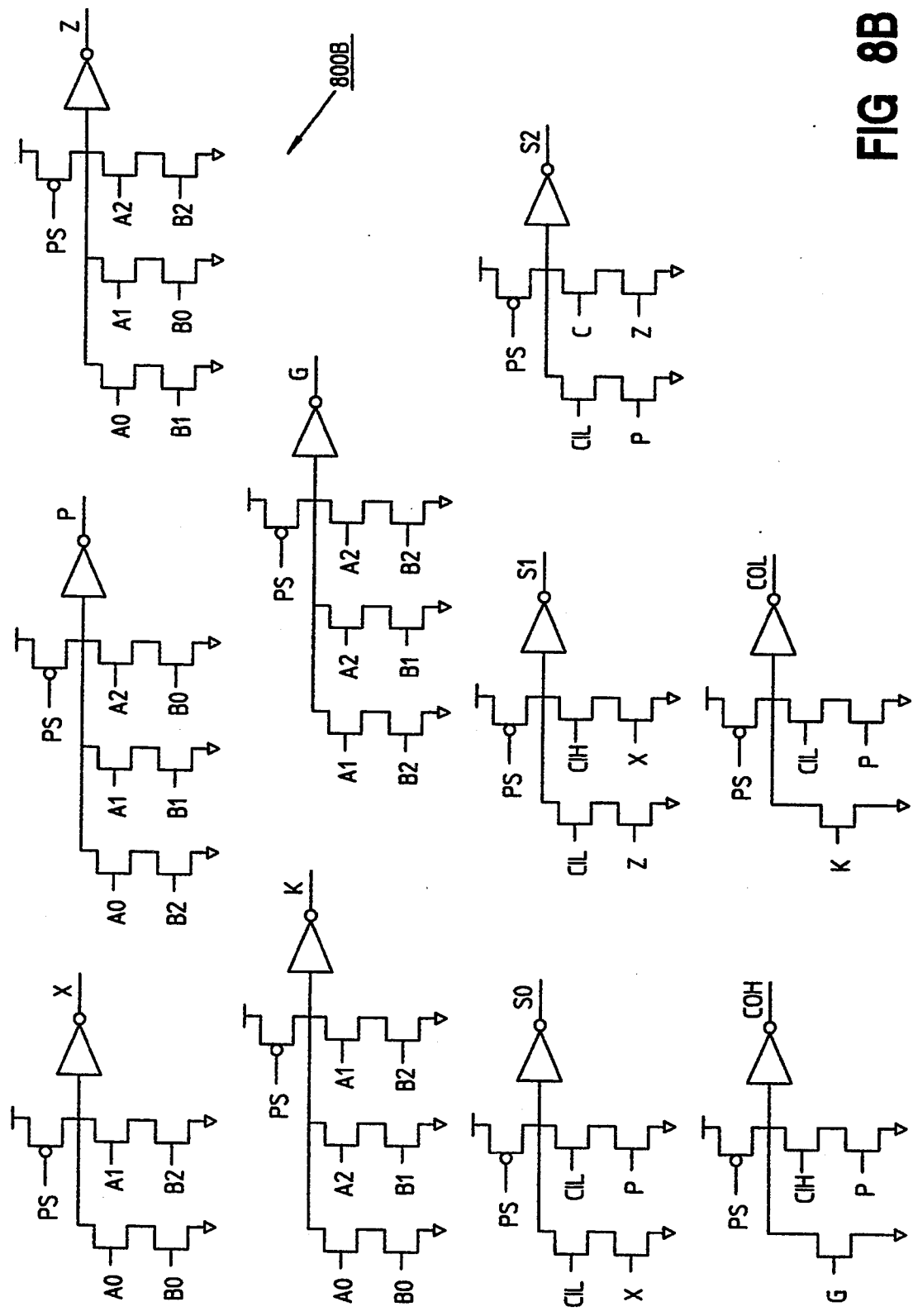
FIG. 8B is a block diagram of a mousetrap logic network for carrying out the ternary ripple carry adder of FIG. 8A.

A mousetrap logic network 800b of FIG. 8B implements a ternary ripple carry adder, illustrated as a high level block diagram 800a in FIG. 8A. The ternary mousetrap logic network 800b of FIG. 8B has three input vectors: two non-Boolean input vectors A = <a2, a1, a0>, B = <b2, b1, b0>, each having three possible valid logic states defined on three logic paths, and a Boolean input vector CI = <CiH, CiL> having two possible valid logic states defined on two logic paths. Further, the network 800b provides two output vectors S = <s2, s1, s0>, Co = <CoH, CoL>, the former being a non-Boolean variable with three possible states and the latter being a Boolean variable with two possible states. Table I below sets forth a truth table for the ternary mousetrap logic gate 800b.

TABLE I

| VECTOR INPUTS | | | INTERMEDIATE VECTORS | | VECTOR OUTPUTS | |
|---|---|---|---|---|---|---|
| A | B | C | I1 | I2 | Co | S |
| 0 | 0 | 0 | K | X | 0 | 0 |
| 0 | 1 | 0 | K | Z | 0 | 1 |
| 0 | 2 | 0 | P | Y | 0 | 2 |
| 1 | 0 | 0 | K | Z | 0 | 1 |
| 1 | 1 | 0 | P | Y | 0 | 2 |
| 1 | 2 | 0 | G | X | 1 | 0 |
| 2 | 0 | 0 | P | Y | 0 | 2 |
| 2 | 1 | 0 | G | X | 1 | 0 |
| 2 | 2 | 0 | G | Z | 1 | 1 |
| 0 | 0 | 1 | K | X | 0 | 1 |
| 0 | 1 | 1 | K | Z | 0 | 2 |
| 0 | 2 | 1 | P | Y | 1 | 0 |
| 1 | 0 | 1 | K | Z | 0 | 2 |
| 1 | 1 | 1 | P | Y | 1 | 0 |
| 1 | 2 | 1 | G | X | 1 | 1 |
| 2 | 0 | 1 | P | Y | 1 | 0 |
| 2 | 1 | 1 | G | X | 1 | 1 |
| 2 | 2 | 1 | G | Z | 1 | 2 |

As indicated in Table I above, two ternary intermediate vector variables $I1 = <X,Y,Z>$, $I2 = <P,K,G>$ are derived in order to ultimately generate the output vectors S, Co. However, because Y=P as indicated in Table I, the requisite logic evaluations can be simplified. Thus, as shown in FIG. 8B, the mousetrap logic network 800b derives intermediate vector I2 in its entirety, but only part $<X, Z>$ of intermediate vector I1. The carry chain of FIG. 4 or some other suitable embodiment can be implemented with the ternary ripple carry adder network 800b of FIG. 8B.

Hence, ternary variables are represented as vectors A, B, Co, I1, I2, while binary variables are represented by vectors C, S. The ripple carry adder network 800b of FIG. 8B performs the following Boolean equations by using various non-Boolean vector variables:

$s0 = (CiL)(a0b0 + a1b2 + a2b1) + (CiH)(a0b2 + a1b1 + a2b0)$
$= X(-Ci) + PCi$
$s1 = (CiL)(a0b1 + a1b0 + a2b2) + (CiH)(a0b0 + a1b2 + a2b1)$
$= Z(-Ci) + XCi$
$s2 = (CiL)(a0b2 + a2b0 + a1b1) + (CiH)(a0b1 + a1b0 + a2b2)$
$= P(-Ci) + ZCi$
$CoH = PCi + G$
$CoL = C(-Ci) + K$
$X = a0\,b0 + a1\,b2 + a2\,b1$
$P = Y = a0\,b2 + a1\,b1 + a2\,b0$
$Z = a0\,b1 + a1\,b0 + a2\,b2$
$K = a0\,b0 + a0\,b1 + a1\,b0$
$G = a1\,b2 + a2\,b1 + a2\,b2$

The foregoing description of preferred embodiments and examples has been presented for purposes of illustration and description. It is not intended to be exhaustive or to limit the present invention to the precise forms disclosed, and obviously many modifications are possible in light of the above teachings. It is intended that the scope of the present invention be broadly defined by the following claims.

Wherefore, the following is claimed:

1. A method for performing a self-timed monotonic logic progression in a logic gate comprising gate components configured in parallel, each of said gate components comprising a ladder logic connected to a plurality of gate inputs and to an inverting buffer mechanism, the inverting buffer mechanism for providing a gate output after receipt of a ladder logic output, and an arming mechanism for periodically precharging the inverting buffer mechanism to drive said gate output to logic low until said inverting buffer mechanism is triggered by said ladder logic output, the method comprising the steps of:
    defining a vector logic variable by a set of vector components of said gate inputs or said gate outputs, or both; and
    encoding timing information in said vector logic variable by defining an invalid vector logic state when all said vector components concurrently exhibit logic low and by defining a unique one of a plurality of valid vector logic states when a subset of said set of vector components exhibits logic high, wherein said subset is nonoverlapping relative to other subsets corresponding with other valid vector logic states, and wherein said subset is greater than one.

2. The method of claim 1, further comprising the step of defining a further subset of said subset as an invalid vector logic state.

3. The method of claim 1, further comprising the step of performing an inclusive OR logic function on vector logic variables at said gate inputs.

4. The method of claim 1, further comprising the step of performing an add predecoder logic function on vector logic variables at said gate inputs.

5. The method of claim 1, further comprising the step of performing a carry propagate logic function on vector logic variables at said gate inputs.

6. The method of claim 1, further comprising the step of performing an exclusive OR logic function on vector logic variables at said gate inputs.

7. The method of claim 1, further comprising the step of performing a Y encoder logic function on vector logic variables at said gate inputs.

8. The method of claim 1, further comprising the step of generating partial products from vector logic variables at said gate inputs.

9. The method of claim 1, further comprising the step of performing ternary ripple carry addition on vector logic variables at said gate inputs.

10. The method of claim 1, wherein said subset is two in number.

11. The method of claim 1, wherein said gate inputs number at least three.

12. The method of claim 1, further comprising the step of encoding more than one invalid logic state with said vector logic variable.

13. The method of claim 1, further comprising the step of encoding a non-Boolean variable with said vector logic variable.

14. The method of claim 1, further comprising the step of employing said logic gate in an adder logic circuit.

15. The method of claim 1, further comprising the step of employing said logic gate within a multiplier logic circuit.

16. A logic gate for a self-timed monotonic logic progression utilizing vector logic variables, each vector logic variable defined by vector components on respective logic paths, each vector logic variable exhibiting either an invalid state or a unique one of a plurality of possible valid states at an instant in time, said invalid state exhibited when all of said logic paths exhibit logic low, each of said valid states exhibited when a subset of said logic paths exhibit logic high, and wherein said subset is nonoverlapping relative to other subsets corresponding with other valid states, the logic gate for deriving an output vector from input vectors, comprising:
logic means comprising a plurality of ladder logics, said logic means for receiving said input vectors, for performing logic functions upon said input vectors, and for providing a ladder logic output at a ladder logic;
buffer means comprising a plurality of inverting buffer mechanisms associated respectively with said ladder logics, said inverting buffer mechanisms configured to output said vector components defining said output vector, said inverting buffer mechanisms configured to maintain said vector components at logic low before receiving said ladder logic output so that said output vector exhibits an invalid state, one of said inverting buffer mechanisms configured to receive said ladder logic output and invert said ladder logic output to thereby derive said output vector in a valid state;
arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain said vector components at logic low; and
wherein said subset is greater than one.

17. The logic gate of claim 16, wherein either an input vector or said output vector, or both, comprises a vector logic variable defined by at least three of said vector components.

18. The logic gate of claim 16, wherein said logic means is configured so that an inclusive OR logic operation is performed on said input vectors to derive said output vector.

19. The logic gate of claim 16, wherein said logic means is configured so that an add predecoder logic operation is performed on said input vectors to derive said output vector.

20. The logic gate of claim 16, wherein said logic means is configured to perform a carry propagate logic operation on said input vectors to derive said output vector.

21. The logic gate of claim 16, wherein said logic means is configured so that an exclusive OR logic operation is performed on said input vectors to derive said output vector.

22. The logic gate of claim 16, wherein said logic means is configured so that a Y encoder logic operation for Booth's algorithm is performed on said input vectors to derive said output vector.

23. The logic gate of claim 16, wherein said logic means is configured so that a partial product generation operation is performed on said input vectors to derive said output vector.

24. The logic gate of claim 16, wherein said logic means is configured so that a ternary ripple carry addition operation is performed on said input vectors to derive said output vector.

25. The logic gate of claim 16, wherein said subset is two in number.

26. The logic gate of claim 16, wherein each of said ladder logics comprises an n-channel metal oxide semiconductor field effect transistor (MOSFET).

27. The logic gate of claim 16, wherein each of said inverting buffer mechanisms comprises a complementary metal oxide semiconductor field effect transistor (CMOSFET).

28. The logic gate of claim 16, wherein each of said arming mechanisms comprises a p-channel metal oxide semiconductor field effect transistor (MOSFET).

29. The logic gate of claim 16, wherein one of said input vectors defines a non-Boolean logic variable.

30. The logic gate of claim 16, wherein said output vector defines a non-Boolean logic variable.

31. The logic gate of claim 16, wherein said logic gate is cascaded with at least two other cascaded logic gates.

32. The logic gate of claim 16, wherein said logic gate is employed within an adder logic circuit.

33. The logic gate of claim 16, wherein said logic gate is employed within a multiplier logic circuit.

34. The logic gate of claim 16, wherein said logic gate is employed within a means for providing floating point operations.

35. A vector logic gate for performing a monotonic logic progression, the vector logic gate comprising:
n logic paths;
a vector logic variable encoded on said n logic paths and having k valid vector logic states;
m of said n logic paths defining each of said k vector logic states;
wherein $k \leq i$ and $i = (n!)/(m!\,(n-m)!)$; and
wherein $m > 2$.

36. The logic gate of claim 35, wherein said vector logic variable exhibits either an invalid state or a valid state at an instant in time, said invalid state exhibited when all of said n logic paths exhibit a logic low, said valid state exhibited when said subset m of said n logic paths exhibit a logic high.

37. The logic gate of claim 35, wherein $m \leq (\frac{1}{2})(n)$.

38. The logic gate of claim 35, further comprising:
logic means comprising a plurality of ladder logics, said logic means for receiving inputs, for performing logic functions upon said inputs, and for providing ladder logic outputs from said ladder logics;
buffer means comprising a plurality of inverting buffer mechanisms associated respectively with said ladder logics, said inverting buffer mechanisms configured to output signals on said n logic paths to define each of said k vector logic states, said inverting buffer mechanisms configured to maintain said n logic paths at logic low before receiving m ladder logic signals on said ladder logic outputs, m of said inverting buffer mechanisms configured to receive and invert said m ladder logic signals to derive one of said k vector logic states; and
arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain said n logic paths at logic low.

39. The logic gate of claim 35, further comprising:
logic means comprising a plurality of ladder logics, said logic means for receiving inputs on said n logic paths, for performing logic functions upon said inputs and for providing ladder logic outputs from said ladder logics;
buffer means comprising a plurality of inverting buffer mechanisms associated respectively with said ladder logics, said inverting buffer mechanisms configured to receive ladder logic signals on said ladder logic outputs and invert said signals to derive a vector logic variable output; and
arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain logic paths defining said output vector at logic low.

40. The logic gate of claim 35, wherein said vector logic variable has an invalid vector logic state for permitting self-timing.

41. A methods for performing a self-timed monotonic logic progression in a logic gate comprising gate components configured in parallel, each of said gate components comprising a ladder logic connected to a plurality of gate inputs and to an inverting buffer mechanism, the inverting buffer mechanism for providing a gate output after receipt of a ladder logic output, and an arming mechanism for periodically precharging the inverting buffer mechanism to drive said gate output to logic low until said inverting buffer mechanism is triggered by said ladder logic output, the method comprising the steps of:
encoding a vector logic variable by a set of vector components of said gate inputs; and
encoding timing information in said vector logic variable by defining an invalid vector logic state when all said vector components concurrently exhibit logic low and by defining a unique one of a plurality of valid vector logic states when a subset of said set of vector components exhibits logic high, wherein said subset is nonoverlapping relative to other subsets corresponding with other valid vector logic states, and wherein said subset is greater than one in number.

42. A method for performing a self-timed monotonic logic progression in a logic gate comprising gate components configured in parallel, each of said gate components comprising a ladder logic connected to a plurality of gate inputs and to an inverting buffer mechanism, the inverting buffer mechanism for providing a gate output after receipt of a ladder logic output, and an arming mechanism for periodically precharging the inverting buffer mechanism to drive said gate output to logic low until said inverting buffer mechanism is triggered by said ladder logic output, the method comprising the steps of:
encoding a vector logic variable by a set of vector components of said gate output; and
encoding timing information in said vector logic variable by defining an invalid vector logic state when all said vector components concurrently exhibit logic low and by defining a unique one of a plurality of valid vector logic states when a subset of said set of vector components exhibits logic high, wherein said subset is nonoverlapping relative to other subsets corresponding with other valid vector logic states, and wherein said subset is greater than one in number.

43. A mousetrap logic gate for performing an add predecoder logic function on vector logic variables and for performing a self-timed monotonic logic progression, each of the vector logic variables defined by vector components on respective logic paths, each vector logic variable exhibiting an invalid state when all of said logic paths exhibit logic low, each vector logic variable exhibiting a unique one of a plurality of possible valid states when a subset of said logic paths exhibits logic high, the gate for deriving an output vector generated from an add predecoder logic operation on input vectors, comprising:
logic means comprising three ladder logics, said logic means for receiving said input vectors, for performing logic functions upon said input vectors, and for providing a ladder logic outputs from said ladder logics;
buffer means comprising three inverting buffer mechanisms associated respectively with said ladder logics, said inverting buffer mechanisms configured to output vector components defining said output vector, said output vector having three valid states, said three valid states including a carry propagate state, a carry kill state, and a carry generate state, said inverting buffer mechanisms configured to maintain said vector components at logic low before receiving a ladder logic signal from said ladder logic outputs so that said output vector exhibits said invalid state, one of said inverting buffer mechanisms configured to receive and invert said ladder logic signal to thereby derive said output vector in one of said three valid states; and
arming means comprising three arming mechanisms associated respectively with said inverted buffer mechanisms, said arming mechanisms configured to periodically precharge said inverting buffer mechanisms respectively to thereby cause said inverting buffer mechanisms to maintain said vector components of said output vector at logic low.

44. A mousetrap logic gate for performing a carry propagate logic function on vector logic variables and for performing a self-timed monotonic logic progression, each of the vector logic variables defined by vector components on respective logic paths, each vector logic variable exhibiting an invalid state when all of said logic paths exhibit logic low, each of the vector logic variables exhibiting a unique one of a plurality of possible valid states when a subset of said logic paths exhibits logic high, the logic gate for deriving an output vector generated from a carry propagate logic operation on input vectors, comprising:
logic means comprising two ladder logics, said logic means for receiving two input vectors, one input vector defining a carry logic state, another input vector defining carry kill, propagate, and generate states, said logic means for performing logic functions upon said input vectors, and for providing ladder logic outputs from said ladder logics;
buffer means comprising two inverting buffer mechanisms associated respectively with said ladder logics, said inverting buffer mechanisms configured to output two vector components defining a carryout output vector, said inverting buffer mechanisms configured to maintain said two vector components at logic low before receiving a ladder logic signal from said logic means so that said carryout output vector exhibits said invalid state, one of said inverting buffer mechanisms configured to receive and invert said ladder logic signal to thereby derive said carryout output vector in said valid state; and arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain said two vector components of said output vector at logic low.

45. A mousetrap logic gate for performing an exclusive OR logic function on vector logic variables and for performing a self-timed monotonic logic progression, each of the vector logic variables defined by vector components on respective logic paths, each vector logic variable exhibiting an invalid state when all of said logic paths exhibit logic low, each of the vector logic variables exhibiting a unique one of a plurality of possible valid states when a subset of said logic paths exhibits logic high the logic gate for deriving an output vector generated from an exclusive OR logic operation on input vectors, the logic gate comprising:

logic means comprising a ladder logic, said logic means for receiving at least two input vectors, each of said input vectors comprising two input vector components, said logic means for performing logic functions upon said input vectors and for providing ladder logic outputs from said ladder logics;

buffer means comprising two inverting buffer mechanisms associated respectively with said ladder logics, said inverting buffer mechanisms configured to output said output vector having two output vector components, said inverting buffer mechanisms configured to maintain said two output vector components of said output vector at logic low prior to receiving a ladder logic signal on said ladder logic outputs so that said output vector exhibits said invalid state, one of said inverting buffer mechanisms configured to receive and invert said ladder logic signal to thereby derive said output vector in said valid state;

arming means comprising two arming mechanisms associated respectively with said inverting buffer mechanisms configured to periodically precharge said inverting buffer mechanisms respectively to thereby cause said inverting buffer mechanisms to maintain said two output vector components of said output vector at logic low; and said logic means, said buffer means, and said arming means, in combination, adapted to perform sad exclusive OR logic operation on said input vectors to derive said output vector.

46. A mousetrap logic gate for performing a Y encoder logic function for Booth's algorithm and for performing a self-timed monotonic logic progression utilizing vector logic variables, and for implementing a self-timed monotonic logic progression utilizing vector variables, each of the vector logic variables defined by vector components on respective logic paths, each of the vector logic variables exhibiting an invalid state when all of said logic paths exhibit logic low, each of the vector logic variables exhibiting a unique one of a plurality of possible valid states when a subset of said logic paths exhibits logic high, the logic gate for deriving an output vector with four output vector components encoding six operation codes from three input vectors, each of said three input vectors having two vector components, each said two input vector components defining a Y-operand, comprising:

logic means comprising four ladder logics, said logic means for receiving said input vectors for performing logic functions upon said input vectors, and for providing ladder logic signals on ladder logic outputs;

buffer means comprising four inverting buffer mechanisms associated respectively with said ladder logics and connected to said ladder logic outputs, said inverting buffer mechanisms configured to output said four output vector components of said output vector, said inverting buffer mechanisms configured to maintain said four output vector components at logic low before receiving a ladder logic signal from said ladder logic outputs so that said output vector exhibits said invalid state, two of said inverting buffer mechanisms configured to permit two of said four vector components to transcend from logic low to logic high after receiving said ladder logic signals on said ladder logic outputs to thereby derive said output vector in said valid state; and arming means comprising four arming mechanisms associated respectively with said inverting buffer mechanisms, said arming mechanisms configured to periodically precharge said inverting buffer mechanisms respectively to thereby cause said inverting buffer mechanisms to maintain said four output vector components at said logic low.

47. A mousetrap logic gate for generating partial products for Booth's algorithm and for implementing a self-timed monotonic logic progression utilizing vector logic variables, each of the vector logic variables defined by vector components on respective logic paths, each of the vector logic variables exhibiting an invalid state when all of said logic paths exhibit logic low, each of the vector logic variable exhibiting a unique one of a plurality of possible valid state when a subset of said logic paths exhibits logic high, the logic gate for deriving an output vector with two output vector components defining a partial product from two input vectors, the two input vectors comprising an X operand vector with two vector components for defining an X operand and an operation code vector with four input vector components for defining six operation codes, comprising;

logic means comprising two ladder logics, said logic means for receiving said input vectors, for performing logic functions upon said input vectors, and for providing ladder logic outputs from said ladder logics;

buffer means comprising two inverting buffer mechanisms associated respectively with said ladder logics, said inverting buffer mechanisms configured to output said output vector, said inverting buffer mechanisms configured to maintain said two output vector components of said output vector at logic low before receiving a ladder logic signal on said ladder logic outputs so that said output vector exhibits said invalid state, one of said inverting buffer mechanisms configured to output logic high after receiving said ladder logic signals on said ladder logic outputs;

arming means comprising two arming mechanisms associated respectively with said inverting buffer mechanisms, said arming mechanisms configuredto periodically precharge said inverting buffer mechanisms respectively to thereby cause said inverting buffer mechanisms to maintain said two output vector components of said output vector at logic low; and said logic means, said buffer means, and said arming means, in combination, adapted to generate said output vector which defines said partial products for said Booth's algorithm from said input vectors.

48. A mousetrap logic gate for implementing a ternary addition operation and for implementing a self-timed monotonic logic progression utilizing vector logic variables, each of the vector logic variables defined by vector components on respective logic paths, each of the vector logic variables exhibiting an invalid state when all of said logic paths exhibit logic low, each of the vector logic variables exhibiting a unique one of a plurality of possible valid states when a subset of said logic paths exhibits logic high, the gate for deriving a sum output vector with three vector components and a carry output vector with two vector components from three input vectors including a first operand with three vector components, a second operand with three vector components, and a carry operand with two vector components, comprising:

logic means comprising ten ladder logics, said logic means for receiving said input vectors, for performing logic functions upon said input vectors, and for providing ladder logic outputs;

buffer means comprising ten inverting buffer mechanisms associated respectively with said ladder logics, said inverting buffer mechanisms configured to output said output vector, said inverting buffer mechanisms configured to maintain said vector components of said output vectors at logic low before receiving a ladder logic signal on said ladder logic outputs so that said output vectors exhibit said invalid state, sad inverting buffer mechanisms configured to receive said ladder logic signal on said ladder logic outputs and to invert said ladder logic signal to thereby derive said output vectors in said valid state;

arming means comprising a plurality of arming mechanisms associated respectively with said inverting buffer mechanisms, sad arming mechanisms configured to precharge said inverting buffer mechanisms respectively to thereby cause said inverting buffer mechanisms to maintain said vector components of said output vectors at logic low; and said logic means, said buffer means, and said arming means, in combination, adapted to perform said ternary addition operation on said input vectors to derive said output vectors.

49. A vector logic method for implementing a self-timed monotonic logic progression in a logic network, the method comprising the steps of:

defining a vector logic variable by a plurality of vector components situated on logic paths of said logic network; and encoding timing information in said vector logic variable by defining said vector logic variable as invalid when all said vector components are concurrently inactive and by defining said vector logic variable as valid when a subset of said vector components are active, wherein said subset corresponding with each valid vector logic state is nonoverlapping relative to other subsets, and wherein said subset is greater than one.

50. The method of claim 49, wherein said logic network comprises a gate having a ladder logic connected to a plurality of gate inputs and to an inverting buffer mechanism, the inverting buffer mechanism for providing gate outputs after receipt of a ladder logic output, and an arming mechanism for periodically precharging the inverting buffer mechanism to drive said gate outputs to a logic low until said inverting buffer mechanism is triggered by said ladder logic.

51. The method of claim 49, wherein said logic network comprises a dynamic logic gate.

52. The method of claim 49, wherein said subset is two in number.

53. The method of claim 49, wherein said gate inputs number at least three.

54. The method of claim 49, further comprising the step of encoding more than one invalid logic state with said vector logic variable.

55. The method of claim 49, further comprising the step of encoding a non-Boolean logic variable with said vector logic variable.

56. The method of claim 49, further comprising the step of employing said logic gate in an adder logic circuit.

57. The method of claim 49, further comprising the step of employing said logic gate within a multiplier logic circuit.

58. A logic gate for performing an add predecoder logic operation with a self-timed monotonic logic progression utilizing vector logic variables, each vector logic variable defined by vector components on respective logic paths, each vector logic variable exhibiting either an invalid state or a unique one of a plurality of possible valid states at an instant in time, said invalid state exhibited when all of said logic paths exhibit logic low, each of said valid states exhibited when a subset of said logic paths exhibit logic high, and wherein said subset is nonoverlapping relative to other subsets corresponding with other valid states, the logic gate for deriving an output vector from input vectors, comprising:

logic means comprising a plurality of ladder logics, said logic means for receiving said input vectors, for performing logic functions upon said input vectors, and for providing a ladder logic output at a ladder logic;

buffer means comprising a plurality of inverting buffer mechanisms associated respectively with said ladder logics, said inverting buffer mechanisms configured to output said vector components defining said output vector, said inverting buffer mechanisms configured to maintain said vector components at logic low before receiving said ladder logic output so that said output vector exhibits an invalid state, one of said inverting buffer mechanisms configured to receive said ladder logic output and invert said ladder logic output to thereby derive said output vector in a valid state;

arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain said vector components at logic low; and wherein said logic means is configured so that said add predecoder logic operation is performed by said gate on said input vectors to derive said output vector.

59. A logic gate for performing a carry propagate logic operation with a self-timed monotonic logic progression utilizing vector logic variables, each vector logic variable defined by vector components on respective logic paths, each vector logic variable exhibiting either an invalid state or a unique one of a plurality of possible valid states at an instant in time, said invalid state exhibited when all of said logic paths exhibit logic low, each of said valid states exhibited when a subset of said logic paths exhibit logic high, and wherein said subset is nonoverlapping relative to other subsets corresponding with other valid states, the logic gate for deriving an output vector from input vectors, comprising:

logic means comprising a plurality of ladder logics, said logic means for receiving said input vectors, for performing logic functions upon said input vectors, and for providing a ladder logic output at a ladder logic;

buffer means comprising a plurality of inverting buffer mechanisms associated respectively with said ladder logics, said inverting buffer mechanisms configured to output said vector components defining said output vector, said inverting buffer mechanisms configured to maintain said vector components at logic low before receiving said ladder logic output so that said output vector exhibits an invalid state, one of said inverting buffer mechanisms configured to receive said ladder logic output and invert said ladder logic output to thereby derive said output vector in a valid state;

arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain said vector components at logic low; and wherein said logic means is configured so that said carry propagate logic operation is performed by said gate on said input vectors to derive said output vector.

60. A logic gate for performing an exclusive OR logic operation with a self-timed monotonic logic progression utilizing vector logic variables, each vector logic variable defined by vector components on respective logic paths, each vector logic variable exhibiting either an invalid state or a unique one of a plurality of possible valid states at an instant in time, said invalid state exhibited when all of said logic paths exhibit logic low, each of said valid states exhibited when a subset of said logic paths exhibit logic high, and wherein said subset is nonoverlapping relative to other subsets corresponding with other valid states, the logic gate for deriving an output vector from input vectors, comprising:

logic means comprising a plurality of ladder logics, said logic means for receiving said input vectors, for performing logic functions upon said input vectors, and for providing a ladder logic output at a ladder logic;

buffer means comprising a plurality of inverting buffer mechanisms associated respectively with said ladder logics, said inverting buffer mechanisms configured to output said vector components defining said output vector, said inverting buffer mechanisms configured to maintain said vector components at logic low before receiving said ladder logic output so that said output vector exhibits an invalid state, one of said inverting buffer mechanisms configured to receive said ladder logic output and invert said ladder logic output to thereby derive said output vector in a valid state;

arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain said vector components at logic low; and wherein said logic means is configured so that said exclusive OR logic operation is performed by said gate on said input vectors to derive said output vector.

61. A logic gate for performing a Y-encoder logic operation for Booth's algorithm using a self-timed monotonic logic progression utilizing vector logic variables, each vector logic variable defined by vector components on respective logic paths, each vector logic variable exhibiting either an invalid state or a unique one of a plurality of possible valid states at an instant in time, said invalid state exhibited when all of said logic paths exhibit logic low, each of said valid states exhibited when a subset of said logic paths exhibit logic high, and wherein said subset is nonoverlapping relative to other subsets corresponding with other valid states, the logic gate for deriving an output vector from input vectors, comprising:

logic means comprising a plurality of ladder logics, said logic means for receiving said input vectors, for performing logic functions upon said input vectors, and for providing a ladder logic output at a ladder logic;

buffer means comprising a plurality of inverting buffer mechanisms associated respectively with said ladder logics, said inverting buffer mechanisms configured to output said vector components defining said output vector, said inverting buffer mechanisms configured to maintain said vector components at logic low before receiving said ladder logic output so that said output vector exhibits an invalid state, one of said inverting buffer mechanisms configured to receive said ladder logic output and invert said ladder logic output to thereby derive said output vector in a valid state;

arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain said vector components at logic low; and wherein said logic means is configured so that said Y encoder logic operation for said Booth's algorithm is performed by said gate on said input vectors to derive said output vector.

62. A logic gate for performing a ternary addition operation with a self-timed monotonic logic progression utilizing vector logic variables, each vector logic variable defined by vector components on respective logic paths, each vector logic variable exhibiting either an invalid state or a unique one of a plurality of possible valid states at an instant in time, said invalid state exhibited when all of said logic paths exhibit logic low, each of said valid states exhibited when a subset of said logic paths exhibit logic high, and wherein said subset is nonoverlapping relative to other subsets corresponding with other valid states, the logic gate for deriving an output vector from input vectors, comprising:

logic means comprising a plurality of ladder logics, said logic means for receiving said input vectors, for performing logic functions upon said input vectors, and for providing a ladder logic output at a ladder logic;

buffer means comprising a plurality of inverting buffer mechanisms associated respectively with said ladder logics, said inverting buffer mechanisms configured to output said vector components defining said output vector, said inverting buffer mechanisms configured to maintain said vector components at logic low before receiving said ladder logic output so that said output vector exhibits an invalid state, one of said inverting buffer mechanisms configured to receive said ladder logic output and invert said ladder logic output to thereby derive said output vector in a valid state;

arming means comprising a plurality of arming mechanisms associated respectively with said inverting buffer mechanisms, said arming mechanisms configured to periodically precharge said inverting buffer mechanisms respectively to thereby cause said inverting buffer mechanisms to maintain said vector components at logic low; and wherein said logic means is configured so that said ternary addition operation is performed by said gate on said input vectors to derive said output vector.

63. A method for performing a self-timed monotonic logic progression in a logic gate comprising gate components configured in parallel, each of said gate components comprising a ladder logic connected to a plurality of gate inputs and to an inverting buffer mechanism, the inverting buffer mechanism for providing a gate output after receipt of a ladder logic output, and an arming mechanism for periodically precharging the inverting buffer mechanism to drive said gate output to logic low until said inverting buffer mechanism is triggered by said ladder logic output, the method comprising the steps of:

defining a vector logic variable by a set of vector components of said gate inputs or said gate outputs or both;

encoding timing information in said vector logic variable by defining an invalid vector logic state when all said vector components concurrently exhibit logic low and by defining a unique one of a plurality of valid vector logic states when a subset of said set of vector components exhibits logic high, and wherein said subset is nonoverlapping relative to other subsets corresponding with other valid vector logic states; and defining a further subset of said subset as an invalid vector logic state.

64. A method for performing an add predecoder logic function with a self-timed monotonic logic progression in a logic gate, the logic gate comprising gate components configured in parallel, each of said gate components comprising a ladder logic connected to a plurality of gate inputs and to an inverting buffer mechanism, the inverting buffer mechanism for providing a gate output after receipt of a ladder logic output, and an arming mechanism for periodically precharging the inverting buffer mechanism to drive said gate output to logic low until said inverting buffer mechanism is triggered by said ladder logic output, the method comprising the steps of:

defining a vector logic variable by a set of vector components of said gate inputs or said gate outputs or both;

encoding timing information in said vector logic variable by defining an invalid vector logic state when all said vector components concurrently exhibit logic low and by defining a unique one of a plurality of valid vector logic states when a subset of said set of vector components exhibits logic high, and wherein said subset is nonoverlapping relative to other subsets corresponding with other valid vector logic states; and performing said add predecoder logic function on vector logic variables at said gate inputs.

65. A method for performing a carry propagate logic function with a self-timed monotonic logic progression in a logic gate, the logic gate comprising gate components configured in parallel, each of said gate components comprising a ladder logic connected to a plurality of gate inputs and to an inverting buffer mechanism, the inverting buffer mechanism for providing a gate output after receipt of a ladder logic output, and an arming mechanism for periodically precharging the inverting buffer mechanism to drive said gate output to logic low until said inverting buffer mechanism is triggered by said ladder logic output, the method comprising the steps of:

defining a vector logic variable by a set of vector components of said gate inputs or said gate outputs or both;

encoding timing information in said vector logic variable by defining an invalid vector logic state when all said vector components concurrently exhibit logic low and by defining a unique one of a plurality of valid vector logic states when a subset of said set of vector components exhibits logic high, and wherein said subset is nonoverlapping relative to other subsets corresponding with other valid vector logic states; and performing said carry propagate logic function on vector logic variables at said gate inputs.

66. A method for performing an exclusive OR logic function with a self-timed monotonic logic progression in a logic gate, the logic gate comprising gate components configured in parallel, each of said gate components comprising a ladder logic connected to a plurality of gate inputs and to an inverting buffer mechanism, the inverting buffer mechanism for providing a gate output after receipt of a ladder logic output, and an arming mechanism for periodically precharging the inverting buffer mechanism to drive said gate output to logic low until said inverting buffer mechanism is triggered by said ladder logic output, the method comprising the steps of:

defining a vector logic variable by a set of vector components of said gate inputs or said gate outputs or both;

encoding timing information in said vector logic variable by defining an invalid vector logic state when all said vector components concurrently exhibit logic low and by defining a unique one of a plurality of valid vector logic states when a subset of said set of vector components exhibits logic high, and wherein said subset is nonoverlapping relative to other subsets corresponding with other valid vector logic states; and performing said exclusive OR logic function on vector logic functions at said gate inputs.

67. A method for performing a Y encoder logic function with a self-timed monotonic logic progression in a logic gate, the logic gate comprising gate components configured in parallel, each of said gate components comprising a ladder logic connected to a plurality of gate inputs and to an inverting buffer mechanism, the inverting buffer mechanism for providing a gate output after receipt of a ladder logic output, and an arming mechanism for periodically precharging the inverting buffer mechanism to drive said gate output to logic low until said inverting buffer mechanism is triggered by said ladder logic output, the method comprising the steps of:

defining a vector logic variable by a set of vector components of said gate inputs or said gate outputs or both;

encoding timing information in said vector logic variable by defining an invalid vector logic state when all said vector components concurrently exhibit logic low and by defining a unique one of a plurality of valid vector logic states when a subset of said set of vector components exhibits logic high, and wherein said subset is nonoverlapping relative to other subsets corresponding with other valid vector logic states; and performing said Y encoder logic function on vector logic variables at said gate inputs.

68. A method for performing ternary addition with a self-timed monotonic logic progression in a logic gate, the logic gate comprising gate components configured in parallel, each of said gate components comprising a ladder logic connected to a plurality of gate inputs and to an inverting buffer mechanism, the inverting buffer mechanism for providing a gate output after receipt of a ladder logic output, and an arming mechanism for periodically precharging the inverting buffer mechanism to drive said gate output to logic low until said inverting buffer mechanism is triggered by said ladder logic output, the method comprising the steps of;

defining a vector logic variable by a set of vector components of said gate inputs or said gate outputs or both;

encoding timing information in said vector logic variable by defining an invalid vector logic state when all said vector components concurrently exhibit logic low and by defining a unique one of a plurality of valid vector logic states when a subset of said set of vector components exhibits logic high, and wherein said subset is nonoverlapping relative to other subsets corresponding with other valid vector logic states; and performing said ternary addition on vector logic variables at said gate inputs.

* * * * *